US012751167B2

(12) United States Patent
Lim et al.

(10) Patent No.: US 12,751,167 B2
(45) Date of Patent: Sep. 29, 2026

(54) DISPLAY DEVICE

(71) Applicant: Samsung Display Co., LTD., Yongin-si (KR)

(72) Inventors: Sang Uk Lim, Yongin-si (KR); Tak Young Lee, Yongin-si (KR); Seung Soo Baek, Yongin-si (KR); Bo Yong Chung, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 262 days.

(21) Appl. No.: 18/621,577

(22) Filed: Mar. 29, 2024

(65) Prior Publication Data

US 2024/0407208 A1 Dec. 5, 2024

(30) Foreign Application Priority Data

Jun. 1, 2023 (KR) ........................ 10-2023-0071069

(51) Int. Cl.
*H10K 59/131* (2023.01)
*H10K 59/35* (2023.01)

(52) U.S. Cl.
CPC ........... *H10K 59/131* (2023.02); *H10K 59/35* (2023.02)

(58) Field of Classification Search
CPC ............................. H10K 59/131; H10K 59/35
See application file for complete search history.

(56) References Cited

U.S. PATENT DOCUMENTS

| | | | | |
|---|---|---|---|---|
| 8,878,206 | B2 | 11/2014 | Lee et al. | |
| 10,971,556 | B1 * | 4/2021 | Fang | H10K 59/131 |
| 11,367,756 | B2 | 6/2022 | Jo et al. | |
| 11,563,077 | B2 | 1/2023 | Jo et al. | |
| 2021/0342027 | A1 * | 11/2021 | Zhang | G06F 3/0446 |
| 2023/0217767 | A1 * | 7/2023 | Shin | H10D 86/60 257/40 |

FOREIGN PATENT DOCUMENTS

| | | |
|---|---|---|
| KR | 10-1983229 | 5/2019 |
| KR | 10-2021-0042216 | 4/2021 |
| KR | 10-2021-0142024 | 11/2021 |

* cited by examiner

*Primary Examiner* — Jacob Y Choi
*Assistant Examiner* — Neil R Prasad
(74) *Attorney, Agent, or Firm* — Harness, Dickey & Pierce, P.L.C.

(57) ABSTRACT

A display device includes sub-pixels. The first and third sub-pixels overlap in a first direction. The second sub-pixel is spaced from the first and third sub-pixels in a second direction. Each of the sub-pixels includes a pixel-circuit layer including a pixel circuit including first and second transistors, a data line, and a scan line, and a light-emitting-element layer on the pixel-circuit layer and including a light emitting element. The pixel circuit includes first to third pixel circuits in the first to third sub-pixels, respectively. The data line includes first to third data lines included in the first to third sub-pixels, respectively, and electrically connected to the first to third pixel circuits, respectively. The first to third data lines are adjacent. The second data line is not between the first and third data lines such that only one side of the second data line faces the first and third data lines.

20 Claims, 24 Drawing Sheets

DISPLAY DEVICE

CROSS-REFERENCE TO RELATED APPLICATION(S)

This application claims priority to and benefits of Korean patent application No. 10-2023-0071069 under 35 U.S.C. § 119, filed on Jun. 1, 2023, in the Korean Intellectual Property Office, the entire contents of which are incorporated herein by reference.

BACKGROUND

1. Technical Field

The disclosure relates to a display device.

2. Description of the Related Art

As information technology is developed, importance of a display device, which is a connection medium between a user and information, has been high-lighted. Such a display device may include a light emitting element capable of emitting light and a pixel circuit for driving the light emitting element, and may include two or more sub-pixels.

Sub-pixels may emit light of an intended luminance. However, sub-pixels of some colors may not emit light with a sufficient luminance, and thus a display device may not clearly output image data of intended quality.

For example, in case that the display device outputs a white box image, in a case where a green sub-pixel does not emit light of a sufficient luminance, a portion of the output image may be observed as magentish.

Accordingly, research for manufacture of a display device capable of outputting light of an intended luminance for each of multiple sub-pixels and for clearly providing image data of intended quality is being actively conducted.

SUMMARY

An aspect of the disclosure is to provide a display device with improved display quality.

According to an embodiment of the disclosure, a display device may include sub-pixels disposed on a base layer and including a first sub-pixel, a second sub-pixel, and a third sub-pixel. The first sub-pixel and the third sub-pixel may overlap in a first direction, the second sub-pixel may be spaced apart from the first sub-pixel and the third sub-pixel in a second direction different from the first direction. Each of the sub-pixels may include a pixel-circuit layer disposed on the base layer and including a pixel circuit including a first transistor and a second transistor, a data line, and a scan line, and a light-emitting-element layer disposed on the pixel-circuit layer and including a light emitting element. The pixel circuit may include a first pixel circuit included in the first sub-pixel, a second pixel circuit included in the second sub-pixel, and a third pixel circuit included in the third sub-pixel. The data line may include a first data line included in the first sub-pixel and electrically connected to the first pixel circuit, a second data line included in the second sub-pixel and electrically connected to the second pixel circuit, and a third data line included in the third sub-pixel and electrically connected to the third pixel circuit. The first data line, the second data line, and the third data line may be adjacent to each other in the first direction. The second data line may not be disposed between the first data line and the third data line such that only one side of the second data line faces the first data line and the third data line.

According to an embodiment, the second data line may be disposed between the pixel circuit and the first data line and the third data line.

According to an embodiment, the third pixel circuit, the first pixel circuit, and the second pixel circuit may be sequentially disposed in the second direction.

According to an embodiment, the first data line and the third data line may be disposed between the pixel circuit and the second data line.

According to an embodiment, the third pixel circuit, the second pixel circuit, and the first pixel circuit may be sequentially disposed in the second direction.

According to an embodiment, the first sub-pixel, the second sub-pixel, and the third sub-pixel may form a pixel part. The pixel part may include a plurality of pixel parts. The plurality of pixel parts may be disposed according to a matrix defined by a pixel row in the first direction and a pixel column in the second direction. The pixel row may include a first pixel row and a second pixel row. The pixel column may include a first pixel column and a second pixel column. The plurality of pixel parts may include a first pixel part disposed in the first pixel row and the first pixel column and a second pixel part disposed in the second pixel row and the first pixel column. The first pixel column and the first sub-pixel and the third sub-pixel in the first pixel column may form an additional pixel part with the second sub-pixel in the second pixel column and the first pixel column.

According to an embodiment, the scan line may include a first scan line corresponding to the sub-pixels disposed in the first pixel row, and a second scan line corresponding to the sub-pixels disposed in the second pixel row.

According to an embodiment, the display device may display an image of checker pattern. In case that the display device displays the image of checker pattern, the first pixel part may display a white box and the second pixel part may display a black box.

According to an embodiment, in case that the display device displays the image of the checker pattern, and in case that the display device displays the image of checker pattern, the first sub-pixel, the second sub-pixel, and the third sub-pixel of the first pixel part emit light, and the first sub-pixel, the second sub-pixel, and the third sub-pixel of the second pixel part do not emit light.

According to an embodiment, in case that the display device displays the image of checker pattern, data signals of a same voltage direction may be supplied to the first data line, the second data line, and the third data line, respectively.

According to an embodiment, the display device may display an image of inverted-checker pattern. In case that the display device displays the image of inverted-checker pattern, a portion of the first pixel part may display a black box, another portion of the first pixel part and a portion of the second pixel part may display a white box, and another portion of the second pixel part may display a black box.

According to an embodiment, in case that the display device displays the image of inverted-checker pattern, the first sub-pixel and the third sub-pixel of the first pixel part may emit light, the second sub-pixel of the first pixel part may not emit light, the second sub-pixel of the second pixel part may emit light, and the first sub-pixel and the third sub-pixel of the second pixel part may not emit light.

According to an embodiment, in case that the display device displays the image of inverted-checker pattern, data signals of a voltage direction different from that of a voltage supplied to the second data line and the third data line may be supplied to the second data line.

According to an embodiment, the light emitting element may include a first electrode, a second electrode, and a light emitting layer electrically connected between the first electrode and the second electrode. The first electrode may be an anode electrode, and may include a (1-1)-th electrode, a (1-2)-th electrode, and a (1-3)-th electrode. The (1-1)-th electrode may be included in the first sub-pixel. The (1-2)-th electrode may be included in the second sub-pixel. The (1-3)-th electrode may be included in the third sub-pixel. The first sub-pixel may be a red sub-pixel. The second sub-pixel may be a green sub-pixel. The third sub-pixel may be a blue sub-pixel.

According to an embodiment, the light emitting element may include an organic light emitting diode (OLED).

According to an embodiment of the disclosure, a display device may display an image of checker pattern and an image of inverted-checker pattern. The display device may include pixel parts disposed on a base layer and including sub-pixels respectively including a first sub-pixel, a second sub-pixel, and a third sub-pixel. The pixel parts may be disposed according to a matrix defined by a pixel row on a first direction and a pixel column on a second direction different from the first direction. Each of the sub-pixels may include a pixel-circuit layer disposed on the base layer and including a pixel circuit including a first transistor and a second transistor, a data line, and a scan line, and a light-emitting-element layer disposed on the pixel-circuit layer and including a light emitting element. The scan line may include a first scan line and a second scan line extending in the first direction and spaced apart in the second direction. The pixel row may include a first pixel row and a second pixel row. The pixel column may include a first pixel column and a second pixel column. The pixel parts may include first pixel parts disposed in the first pixel row and second pixel parts disposed in the second pixel row. The first scan line may correspond to the first pixel parts. The second scan line may correspond to the second pixel parts. The pixel circuit may include a first pixel circuit included in the first sub-pixel, a second pixel circuit included in the second sub-pixel, and a third pixel circuit included in the third sub-pixel. The data line may include a first data line included in the first sub-pixel and electrically connected to the first pixel circuit, a second data line included in the second sub-pixel and electrically connected to the second pixel circuit, and a third data line included in the third sub-pixel and electrically connected to the third pixel circuit. In case that the display device displays the image of checker pattern, the first sub-pixel, the second sub-pixel, and the third sub-pixel of the first pixel part disposed in the first pixel row and the first pixel column may emit light, and the first sub-pixel, the second sub-pixel, and the third sub-pixel of the second pixel part disposed in the second pixel row and the first pixel column may not emit light. In case that the display device displays the image of inverted-checker pattern, the first sub-pixel and the third sub-pixel of the first pixel part disposed in the first pixel row and the first pixel column may emit light, the second sub-pixel does not emit light, the first sub-pixel and the third sub-pixel of the second pixel part disposed in the second pixel row and the first pixel column may not emit light, and the second sub-pixel may emit light. The first data line, the second data line, and the third data line may be adjacent to each other in the first direction. The second data line may not be disposed between the first data line and the third data line such that only one side of the second data line faces the first data line and the third data line.

According to an embodiment of the disclosure, a display device includes pixel parts disposed on a base layer and including sub-pixels respectively including a first sub-pixel, a second sub-pixel, and a third sub-pixel. The pixel parts may be disposed according to a matrix defined by a pixel row on a first direction and a pixel column on a second direction different from the first direction. Each of the sub-pixels may include a pixel-circuit layer disposed on the base layer and including a pixel circuit including a first transistor and a second transistor, a data line, and a scan line, and a light-emitting-element layer disposed on the pixel-circuit layer and including a light emitting element. The sub-pixels may be spaced apart from each other in an oblique direction different from the first direction and the second direction. The pixel circuit may include a first pixel circuit included in the first sub-pixel, a second pixel circuit included in the second sub-pixel, and a third pixel circuit included in the third sub-pixel. The data line may include a first data line included in the first sub-pixel and electrically connected to the first pixel circuit, a second data line included in the second sub-pixel and electrically connected to the second pixel circuit, and a third data line included in the third sub-pixel and electrically connected to the third pixel circuit. The first data line, the second data line, and the third data line may be adjacent to each other in the first direction. The second data line may not be disposed between the first data line and the third data line such that only one side of the second data line faces the first data line and the third data line.

According to an embodiment, the light emitting element may include a first electrode, a second electrode, and a light emitting layer electrically connected between the first electrode and the second electrode. The first electrode may be an anode electrode, and may include a (1-1)-th electrode, a (1-2)-th electrode, and a (1-3)-th electrode. The (1-1)-th electrode may be included in the first sub-pixel. The (1-2)-th electrode may be included in the second sub-pixel. The (1-3)-th electrode may be included in the third sub-pixel. The first sub-pixel may be a red sub-pixel. The second sub-pixel may be a green sub-pixel. The third sub-pixel may be a blue sub-pixel.

According to an embodiment, the display device may further include a first bridge pattern electrically connected to the first data line through a first contact member, a second bridge pattern electrically connected to the second data line through a second contact member, and a third bridge pattern electrically connected to the third data line through a third contact member. The (1-2)-th electrode may not overlap the first contact member and the third contact member in a plan view.

According to an embodiment, the (1-3)-th electrode may overlap the third contact member in a plan view.

According to an embodiment of the disclosure, a display device with improved display quality may be provided.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
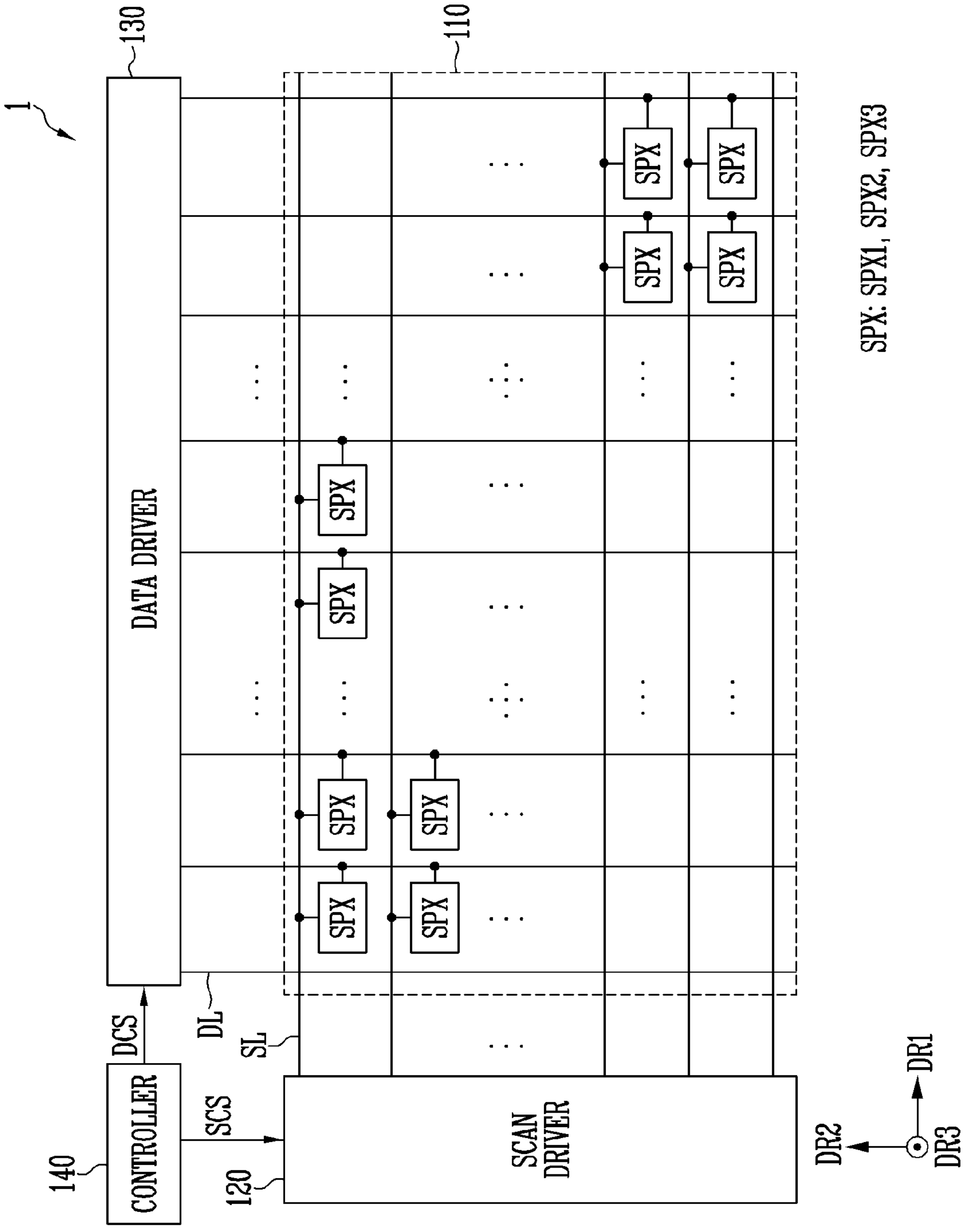
FIG. 1 is a schematic block diagram illustrating a display device according to an embodiment.

The disclosure may be modified in various manners and have various forms. Therefore, only certain specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and scope of the disclosure.

In the drawings, sizes, thicknesses, ratios, and dimensions of the elements may be exaggerated for ease of description and for clarity. Like numbers refer to like elements throughout.

Terms such as “first”, “second”, and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component.

In the following description, the singular expressions include plural expressions unless the context clearly dictates otherwise.

In the specification and the claims, the term “and/or” is intended to include any combination of the terms “and” and “or” for the purpose of its meaning and interpretation. For example, “A and/or B” may be understood to mean any combination including “A, B, or A and B.” The terms “and” and “or” may be used in the conjunctive or disjunctive sense and may be understood to be equivalent to “and/or.”

For the purposes of this disclosure, the phrase “at least one of A and B” may be construed as A only, B only, or any combination of A and B. Also, “at least one of X, Y, and Z” and “at least one selected from the group consisting of X, Y, and Z” may be construed as X only, Y only, Z only, or any combination of two or more of X, Y, and Z.

It should be understood that in the application, a term of “include”, “have”, or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance.

A case where a portion of a layer, a layer, an area, a plate, or the like is referred to as being “on” another portion, it includes not only a case where the portion is “directly on” another portion, but also a case where there is further another portion between the portion and another portion.

In the specification, in case that a portion of a layer, a layer, an area, a plate, or the like is formed (disposed) on another portion, a forming direction is not limited to an upper direction but includes forming the portion on a side surface or in a lower direction. In case that a portion of a layer, a layer, an area, a plate, or the like is formed “under” another portion, this includes not only a case where the portion is “directly beneath” another portion but also a case where there is further another portion between the portion and another portion.

The term “overlap” or “overlapped” mean that a first object may be above or below or to a side of a second object, and vice versa. Additionally, the term “overlap” may include layer, stack, face or facing, extending over, covering, or partly covering or any other suitable term as would be appreciated and understood by those of ordinary skill in the art.

When an element is described as “not overlapping” or to “not overlap” another element, this may include that the elements are spaced apart from each other, offset from each other, or set aside from each other or any other suitable term as would be appreciated and understood by those of ordinary skill in the art.

The terms “face” and “facing” mean that a first element may directly or indirectly oppose a second element. In a case in which a third element intervenes between the first and second element, the first and second element may be understood as being indirectly opposed to one another, although still facing each other.

“About” or “approximately” or “substantially” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display device 1 according to an embodiment is described with reference to FIG. 1. FIG. 1 is a schematic block diagram illustrating a display device according to an embodiment.

The display device 1 may be configured to emit light. The display device 1 may be an electronic device using a light emitting element LD (refer to FIG. 2) as a light source. According to an embodiment, the display device 1 may include a pixel part 110, a scan driver 120, a data driver 130, and a controller 140.

The pixel part 110 may include sub-pixels SPX connected to a scan line SL and a data line DL. According to an embodiment, one or more of the sub-pixels SPX may form (or configure) a pixel (or a pixel part PXU (refer to FIG. 7)). Each of the sub-pixels SPX may be one of first to third sub-pixels SPX1, SPX2, and SPX3. For example, the sub-pixel SPX may include the first sub-pixel SPX1 emitting light of a first color, the second sub-pixel SPX2 emitting light of a second color, and the third sub-pixel SPX3 emitting light of a third color. However, the disclosure is not limited to the above-described example.

The first color having a first wavelength band may be red. For example, the first wavelength band may be a wavelength band of approximately 600 nm to approximately 750 nm. The second color having a second wavelength band may be green. For example, the second wavelength band may be a wavelength band of approximately 480 nm to approximately 560 nm. The third color having a third wavelength band may be blue. For example, the third wavelength band may be a wavelength band of approximately 370 nm to approximately 460 nm.

The scan driver 120 may be disposed on a side of the pixel part 110. The scan driver 120 may receive a first control signal SCS from the controller 140. The scan driver 120 may provide a scan signal to the sub-pixel SPX. The scan driver 120 may supply the scan signal to the scan lines SL in response to the first control signal SCS. For example, the scan signal may be provided to the sub-pixel SPX through a first extension scan line SL_H (refer to FIG. 10) extending in a first direction DR1 and a second extension scan line SL_V (refer to FIG. 10) extending in a second direction DR2.

The first control signal SCS may be a signal for controlling a driving timing of the scan driver 120. The first control signal SCS may include a scan start signal and clock signals for the scan signal. The scan signal may be set to a gate-on level corresponding to a type of a transistor to which a corresponding scan signal is supplied.

The data driver 130 may be disposed on a side of the pixel part 110. The data driver 130 may receive a second control signal DCS from the controller 140. The data driver 130 may provide a data signal to the sub-pixel SPX. The data driver 130 may supply the data signal to the data line DL in response to the second control signal DCS. For example, the second control signal DCS may be provided to the sub-pixel SPX through the data line DL. The second control signal DCS may be a signal for controlling a driving timing of the data driver 130.

According to an embodiment, the display device 1 may further include a compensator (not shown). The compensator may receive a third control signal for sensing and deterioration compensation of the sub-pixels SPX from the controller 140. The compensator may receive a sensing value (current or voltage information) extracted from the sub-pixel SPX through a sensing line SENL (refer to FIG. 3). The compensator may generate a compensation value for compensating for deterioration of the sub-pixel SPX based on the sensing value.

A portion (first scan line SL1) of the scan line SL may extend in the first direction DR1, and may be electrically connected to the sub-pixel SPX of a corresponding pixel row through another portion (second scan line SL2) of the scan line SL extending in the second direction DR2. Accordingly, the scan line SL may supply the scan signal to the corresponding sub-pixel SPX.

The data line DL may extend on a pixel column (for example, in the second direction DR2) and may be electrically connected to the sub-pixel SPX. The data line DL may supply the data signal to the connected sub-pixel SPX.

Here, a pixel row direction may be a horizontal direction and may mean the first direction DR1. The pixel column direction may be a vertical direction and may mean the second direction DR2.

In FIG. 1, the scan driver 120, the data driver 130, and the controller 140 are shown separately, but at least a portion of the scan driver 120, the data driver 130, and the controller 140 may be integrated into one module or integrated circuit (IC) chip.

Figure 2:
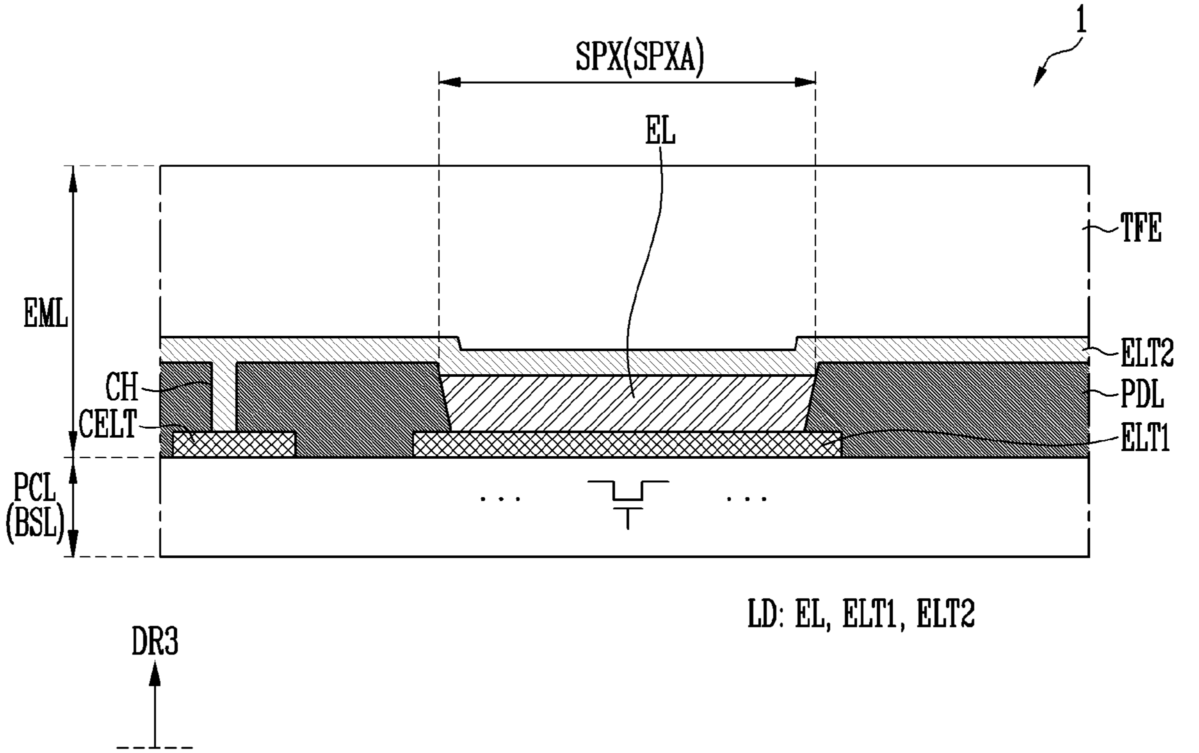
FIG. 2 is a schematic cross-sectional view illustrating a display device according to an embodiment.

A stack structure including the light emitting element LD for forming the sub-pixel SPX according to an embodiment is described with reference to FIG. 2. FIG. 2 is a schematic cross-sectional view illustrating a display device according to an embodiment.

According to an embodiment, the display device 1 (or the sub-pixel SPX) may include light emitting elements LD. According to an embodiment, the light emitting elements LD may be provided in various forms. In the specification, for convenience of description, the disclosure is described based on an embodiment in which the light emitting elements LD include an organic light emitting element (organic light emitting diode (OLED)).

Referring to FIG. 2, the display device 1 may include a pixel-circuit layer PCL and a light-emitting-element layer EML.

The pixel-circuit layer PCL may be a layer including a pixel circuit PXC (refer to FIG. 3) for driving the light emitting elements LD. The pixel-circuit layer PCL may include a base layer BSL, conductive layers for forming the pixel circuits PXC, and insulating layers disposed between the conductive layers. A detailed description of a stack structure for forming the pixel-circuit layer PCL is described later with reference to drawings after FIG. 6.

According to an embodiment, the base layer BSL may be a base substrate or a base member for supporting the display device 1. The substrate may be a rigid substrate of a glass material. In another embodiment, the base layer BSL may be a flexible substrate of which bending, folding, rolling, or the like is possible. The base layer BSL may include an insulating material such as a polymer resin such as polyimide.

According to an embodiment, the pixel circuit PXC may include a thin film transistor and may be electrically connected to the light emitting elements LD to provide an electrical signal for the light emitting elements LD to emit light.

The light-emitting-element layer EML may be disposed on the pixel-circuit layer PCL. According to an embodiment, the light-emitting-element layer EML may include the light emitting element LD, a connection electrode CELT, a pixel defining layer PDL, and an encapsulation layer TFE.

The light emitting element LD may be disposed on the pixel-circuit layer PCL. According to an embodiment, the light emitting element LD may include a first electrode ELT1, a light emitting layer EL, and a second electrode ELT2. According to an embodiment, the light emitting layer EL may be disposed in an area defined by the pixel defining layer PDL. The pixel defining layer PDL may be adjacent to a periphery of the light emitting layer EL. A surface of the light emitting layer EL may be electrically connected to the first electrode ELT1, and another surface of the light emitting layer EL may be electrically connected to the second electrode ELT2.

The first electrode ELT1 may be an anode electrode for the light emitting layer EL, and the second electrode ELT2 may be a common electrode (or a cathode electrode) for the light emitting layer EL. According to an embodiment, the first electrode ELT1 and the second electrode ELT2 may include a conductive material. For example, the first electrode ELT1 may include a conductive material having a reflective property, and the second electrode ELT2 may include a transparent conductive material. However, the disclosure is not limited thereto.

The light emitting layer EL may have a multilayer thin film structure including a light generation layer. The light emitting layer EL may include a hole injection layer for injecting a hole, a hole transport layer having an excellent hole transport property and for increasing a chance of recombination of a hole and an electron by suppressing a movement of an electron that is not combined in the light generation layer, the light generation layer for emitting light by the recombination of the injected electron and hole, a hole blocking layer for suppressing a movement of a hole that is not combined in the light generation layer, an electron transport layer for smoothly transporting the electron to the light generation layer, and an electron injection layer for injecting the electron. The light emitting layer EL may emit light based on an electrical signal provided from the first electrode ELT1 and the second electrode ELT2.

The light emitting layer EL may form the sub-pixel SPX. The light emitting layer EL may form a sub-pixel area SPXA from which light of one color is emitted. In a plan view, an area of the light emitting layer EL and the sub-pixel area SPXA may correspond to each other. For example, each light emitting layer EL may correspond to each sub-pixel area SPXA. According to an embodiment, an area where the first electrode ELT1 is disposed may be an anode area of the light emitting element LD, and may correspond to an area where the light emitting layer EL is disposed.

The connection electrode CELT may be disposed on the pixel-circuit layer PCL. The connection electrode CELT may be electrically connected to the second electrode ELT2 through a contact structure CH passing through the pixel defining layer PDL. The connection electrode CELT may be electrically connected to a second power line PL2 (refer to FIG. 3) and may supply a cathode signal to the second electrode ELT2. The connection electrode CELT may be formed in the same process as the second electrode ELT2 and may include the same material as the second electrode ELT2.

The pixel defining layer PDL may be disposed on the pixel-circuit layer PCL to define a position where the light emitting layer EL is arranged. The pixel defining layer PDL may include an organic material. According to an embodiment, the pixel defining layer PDL may include at least one of acrylic resin, epoxy resin, phenol resin, polyamide resin, and polyimide resin. However, the disclosure is not limited thereto.

The encapsulation layer TFE may be disposed on the light emitting element LD (for example, the second electrode ELT2). The encapsulation layer TFE may offset a step difference generated by the light emitting element LD and the pixel defining layer PDL. The encapsulation layer TFE may include insulating layers covering the light emitting element LD. According to an embodiment, the encapsulation layer TFE may have a structure in which an inorganic layer and an organic layer are stacked on each other. According to an embodiment, the encapsulation layer TFE may be a thin film encapsulation layer.

Figure 3:
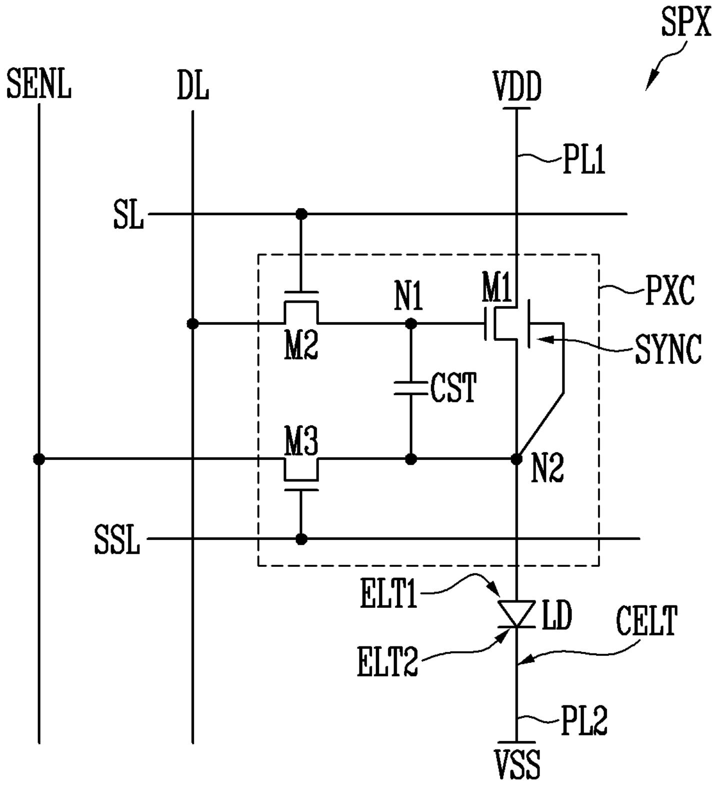
FIG. 3 is a schematic diagram illustrating a pixel circuit included in a sub-pixel according to an embodiment.

A pixel circuit PXC according to an embodiment is described with reference to FIG. 3. FIG. 3 is a schematic diagram illustrating a pixel circuit included in a sub-pixel according to an embodiment. Referring to FIG. 3, the sub-pixel SPX may include the pixel circuit PXC. The pixel circuit PXC may be configured to drive the light emitting elements LD. According to an embodiment, each of the sub-pixels SPX for forming one pixel part may include the pixel circuit PXC.

The sub-pixel SPX may be electrically connected to the scan line SL, the data line DL, a first power line PL1, and a second power line PL2. The sub-pixel SPX may be further electrically connected to the sensing line SENL.

The sub-pixel SPX may include the light emitting elements LD configured to emit light corresponding to a data signal provided from the data line DL.

The pixel circuit PXC may be disposed between the first power line PL1 and the light emitting elements LD. The pixel circuit PXC may be electrically connected to the scan line SL to which a first scan signal is supplied and the data line DL to which the data signal is supplied. The pixel circuit PXC may be electrically connected to a control line SSL to which a second scan signal is supplied, and may be electrically connected to reference power (or initialization power) or the sensing line SENL connected to a sensing circuit.

According to an embodiment, the second scan signal may be the same as or different from the first scan signal. In case that the second scan signal is the same as the first scan signal, the control line SSL may be integrated with the scan line SL.

The pixel circuit PXC may include one or more circuit elements. For example, the pixel circuit PXC may include a first transistor M1, a second transistor M2, a third transistor M3, and a storage capacitor CST.

In FIG. 3, all transistors included in the pixel circuit PXC are N-type transistors, but the disclosure is not limited thereto. For example, at least one of the first, second, and third transistors M1, M2, and M3 may be changed to a P-type transistor. A structure and a driving method of the sub-pixel SPX may be variously changed according to an embodiment.

The first transistor M1 may be electrically connected between the first power line PL1 and a second node N2. The second node N2 may be a node to which the pixel circuit PXC and the light emitting element LD are connected. For example, the second node N2 may be a node to which a second transistor electrode (for example, a (2_1)-th transistor electrode TE2_1 (refer to FIG. 10)) of the first transistor M1 and the first electrode ELT1 of the light emitting LD are connected. A second transistor electrode (for example, a (2_2)-th transistor electrode TE2_2 (refer to FIG. 10)) of the first transistor M1 may be electrically connected to the first power line PL1. A first gate electrode GE1 (refer to FIG. 10) of the first transistor M1 may be electrically connected to a first node N1. The first transistor M1 may control a driving current supplied to the light emitting element LD in response to a voltage of the first node N1. The first transistor M1 may be a driving transistor.

The transistors M1 to M3 may be N-type transistors, a first transistor electrode may be a drain electrode, and a second transistor electrode may be a source electrode. However, the disclosure is not limited thereto. The transistors M1 to M3 may be P-type transistors, a first transistor electrode may be a source electrode, and a second transistor electrode may be a drain electrode.

According to an embodiment, a sink electrode layer SYNC electrically connected to the second node N2 to receive an anode signal supplied to the light emitting element LD may be disposed under the first transistor M1 (for example, the gate electrode of the first transistor M1).

The second transistor M2 may be electrically connected between the data line DL and the first node N1. A second gate electrode GE2 (refer to FIG. 10) of the second transistor M2 may be electrically connected to the scan line SL. The second transistor M2 may be turned on in case that a first scan signal of a gate-on voltage (for example, a high level voltage) is supplied from the scan line SL, to electrically connect the data line DL and the first node N1.

For each frame period, a data signal of a corresponding frame may be supplied to the data line DL, and the data signal may be transferred to the first node N1 through the second transistor M2 during a period in which the first scan signal of the gate-on voltage is supplied. The second transistor M2 may be a switching transistor for transferring each data signal to an inside of the sub-pixel SPX.

An electrode of the storage capacitor CST may be electrically connected to the first node N1 and another electrode may be electrically connected to the second node N2. The storage capacitor CST may charge a voltage corresponding to the data signal supplied to the first node N1 during each frame period.

The third transistor M3 may be electrically connected between the second node N2 and the sensing line SENL. A third gate electrode GE3 (refer to FIG. 10) of the third transistor M3 may be electrically connected to the control line SSL. The third transistor M3 may be turned on in case that a second scan signal (or a first scan signal) of a gate-on voltage (for example, a high level voltage) is supplied from the control line SSL, to transfer a reference voltage (or an initialization voltage) supplied to the sensing line SENL to the second node N2, or transfer a voltage of the second node N2 to the sensing line SENL. The voltage of the second node N2 transferred to a sensing circuit through the sensing line SENL may be provided to an external circuit (for example, the controller 140) to be used for compensating for a characteristic deviation of the sub-pixels SPX.

The light emitting element LD may be electrically connected between the first power line PL1 and the second power line PL2. For example, the first electrode ELT1 of the light emitting element LD may be electrically connected to the pixel circuit PXC, and the second electrode ELT2 of the light emitting element LD may be electrically connected to the second power line PL2 through the connection electrode CELT.

Power of the first power line PL1 and power of the second power line PL2 may have different potentials. For example, the power of the first power line PL1 may be high potential pixel power supplied from first power VDD, and the power of the second power line PL2 may be low potential pixel power supplied from second power VSS. A potential difference between the power of the first power line PL1 and the power of the second power line PL2 may be set to a threshold voltage or higher of the light emitting elements LD.

The first power line PL1 may be electrically connected to the first transistor M1. The second power line PL2 may be electrically connected to the cathode electrode (for example, the second electrode ELT2) of the light emitting element LD.

Each light emitting element LD may be connected in a forward direction between the first power line PL1 and the second power line PL2 to form each effective light source. The effective light sources may be gathered to configure the light emitting elements LD of the sub-pixel SPX.

The light emitting elements LD may emit light with a luminance corresponding to the driving current supplied through the pixel circuit PXC. During each frame period, the pixel circuit PXC may supply the driving current corresponding to the data signal to the light emitting element LD. The light emitting element LD may emit light with a luminance corresponding to a current flowing therethrough.

The pixel circuit PXC for the sub-pixel SPX according to an embodiment is not limited to the above-described example. According to an embodiment, the pixel circuit PXC may further include seven transistors and one storage capacitor.

Figure 4:
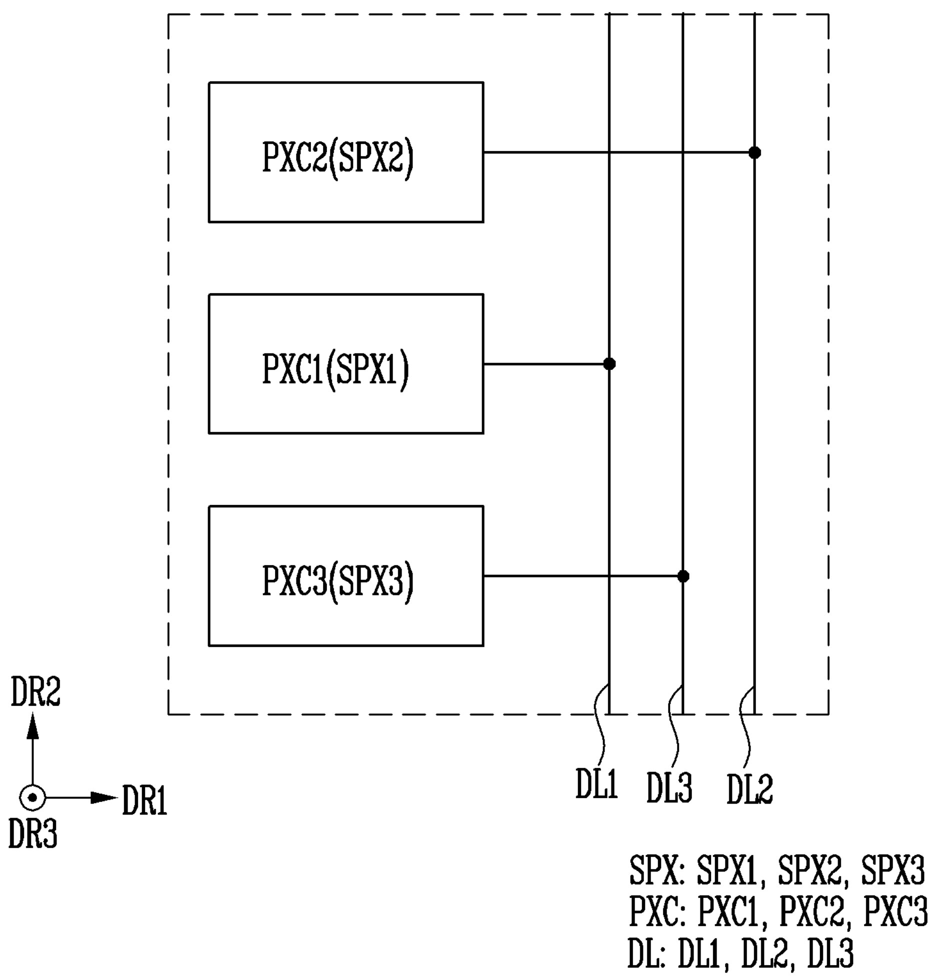
FIGS. 4 and 5 are schematic diagrams illustrating a connection relationship between data lines and pixel circuits according to an embodiment.
Figure 5:
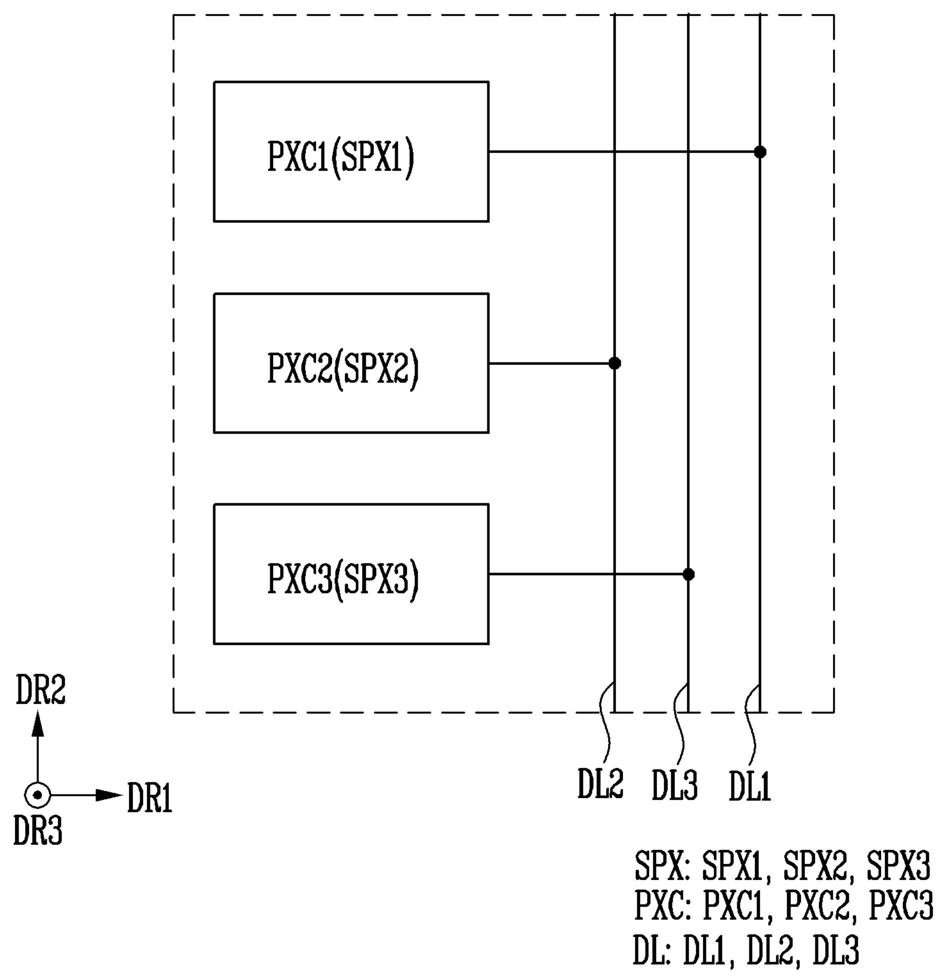

An arrangement structure of data lines DL according to an embodiment is described with reference to FIGS. 4 and 5. FIGS. 4 and 5 are schematic diagrams illustrating a connection relationship between data lines and pixel circuits according to an embodiment.

The display device 1 according to an embodiment may include a feature in the arrangement structure of the data lines DL. For example, the display device 1 according to an embodiment may be characterized in that only one side of a second data line DL2 for the second sub-pixel SPX2, which is a green sub-pixel, faces data lines DL1 and DL3 of sub-pixels of different colors.

The data lines DL may generally extend in the second direction DR2, and may include the first data line DL1 included in the first sub-pixel SPX1, the second data line DL2 included in the second sub-pixel SPX2, and the third data line DL3 included in the third sub-pixel SPX3.

The pixel circuit PXC may include a first pixel circuit PXC1 included in the first sub-pixel SPX1 to drive the light emitting elements LD of the first sub-pixel SPX1, a second pixel circuit PXC2 included in the second sub-pixel SPX2 to drive the light emitting elements LD of the second sub-pixel SPX2, and a third pixel circuit PXC3 included in the third sub-pixel SPX3 to drive the light emitting elements LD of the third sub-pixel SPX3.

The first data line DL1 may be electrically connected to the first pixel circuit PXC1. The second data line DL2 may be electrically connected to the second pixel circuit PXC2. The third data line DL3 may be electrically connected to the third pixel circuit PXC3.

According to an embodiment, the second data line DL2 may not be disposed between the first data line DL1 and the third data line DL3, and thus only one side of the second data line DL2 may face the first data line DL1 and the third data line DL3.

For example (refer to FIG. 4), one side of the second data line DL2 may face an area opposite to an area where the pixel circuits PXC are disposed, and another side of the second data line DL2 may face the first data line DL1 and the third data line DL3. According to an embodiment, the third pixel circuit PXC3, the first pixel circuit PXC1, and the second pixel circuit PXC2 may be sequentially disposed in the second direction DR2.

In another example (refer to FIG. 5), one side of the second data line DL2 may face the pixel circuits PXC, and the other side of the second data line DL2 may face the first data line DL1 and the third data line DL3. According to an embodiment, the third pixel circuit PXC3, the second pixel circuit PXC2, and the first pixel circuit PXC1 may be sequentially disposed in the second direction DR2.

According to an embodiment, as the second data line DL2 is disposed according to the above-described structure, a risk of distorting a data charging rate for emitting light of the sub-pixels SPX is reduced, and thus display quality may be improved.

According to an embodiment, as the second data line DL2 is disposed according to the above-described structure, a structure in which a repair process for the pixel circuit PXC may be suitably performed may be implemented.

Hereinafter, the above-described technical effect is described in more detail in connection with the structure of the pixel circuit PXC according to an embodiment.

First, a display device 1 according to an embodiment is described with reference to FIGS. 6 to 18. Description that is redundant to the above-described content is only briefly described or is not repeated.

Figure 6:
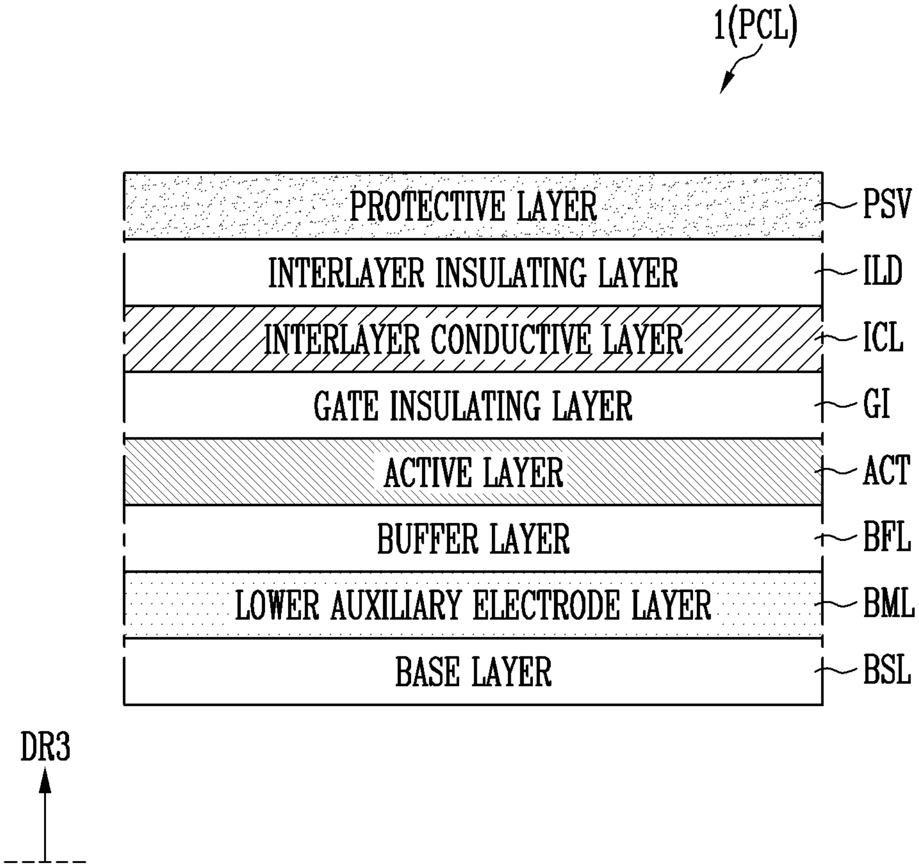
FIG. 6 is a schematic cross-sectional view illustrating a stack structure of a display device according to an embodiment.

FIG. 6 is a schematic cross-sectional view illustrating a stack structure of a display device according to an embodiment. Referring to FIG. 6, a stack structure included in the display device 1 (for example, the pixel-circuit layer PCL) according to an embodiment may have a form in which at least a portion is patterned in a structure in which a base layer BSL, a lower auxiliary electrode layer BML, a buffer layer BFL, an active layer ACT, a gate insulating layer GI, an interlayer conductive layer ICL, an interlayer insulating layer ILD, and a protective layer PSV are stacked on each other. For example, the above-described electrode layers may be patterned according to one structure to form the pixel circuit PXC. The above-described electrode layers may be patterned according to one structure to form a portion of the first power line PL1 and the second power line PL2.

The base layer BSL may form (or configure) a base surface of the display device 1. As described above, the base layer BSL may include various materials, and an example thereof is not particularly limited.

The buffer layer BFL may be a layer for preventing diffusion of an impurity or moisture permeation to the active layer ACT including a semiconductor. According to an embodiment, the buffer layer BFL may include at least one of silicon nitride (SiNx), silicon oxide (SiOx), silicon oxynitride (SiOxNy), and aluminum oxide (AlxOy). However, the disclosure is not limited to the above-described example.

The active layer ACT may include the semiconductor. For example, the active layer ACT may include at least one of polysilicon, low temperature polycrystalline silicon (LTPS), amorphous silicon, and an oxide semiconductor. According to an embodiment, the active layer ACT may form a channel of the first transistor M1, the second transistor M2, and the third transistor M3, and a portion contacting a first transistor electrode (for example, a drain electrode) or a second transistor electrode (for example, a source electrode) of each of the first transistor M1, the second transistor M2, and the third transistor M3 may be doped with an impurity as a portion of the interlayer conductive layer ICL.

The lower auxiliary electrode layer BML and the interlayer conductive layer ICL may include a conductive material. According to an embodiment, each of the lower auxiliary electrode layer BML and the interlayer conductive layer ICL may include one or more conductive layers. According to an embodiment, each of the lower auxiliary electrode layer BML and the interlayer conductive layer ICL may include at least one of gold (Au), silver (Ag), aluminum (Al), molybdenum (Mo), chromium (Cr), titanium (Ti), nickel (Ni), neodymium (Nd), copper (Cu), and platinum (Pt). However, the disclosure is not limited to the above-described example.

The gate insulating layer GI, the interlayer insulating layer ILD, and the protective layer PSV may be disposed between respective layers to electrically separate the active layer ACT and the interlayer conductive layer ICL from each other. According to an embodiment, the layers may be electrically connected to each other through contact members CNP (refer to FIG. 10) formed in at least one of the gate insulating layer GI, the interlayer insulating layer ILD, and the protective layer PSV.

According to an embodiment, the gate insulating layer (GI), the interlayer insulating layer (ILD), and/or the protective layer PSV may include at least one of silicon nitride (SiNx), silicon oxide (SiOx), silicon oxynitride (SiOxNy), and aluminum oxide (AlxOy). However, the disclosure is not limited to the above-described example. According to an embodiment, the gate insulating layer GI, the interlayer insulating layer ILD, and/or the protective layer PSV may include an organic material.

According to an embodiment, the protective layer PSV may be a via layer. The protective layer PSV may be an uppermost layer of the pixel-circuit layer PCL. The protective layer PSV may be a layer directly adjacent to the light-emitting-element layer EML. According to an embodiment, the protective layer PSV may cover the first gate electrode GE1. According to an embodiment, the protective layer PSV may contact the first electrode ELT1 and the connection electrode CELT of the light-emitting-element layer EML.

Figure 7:
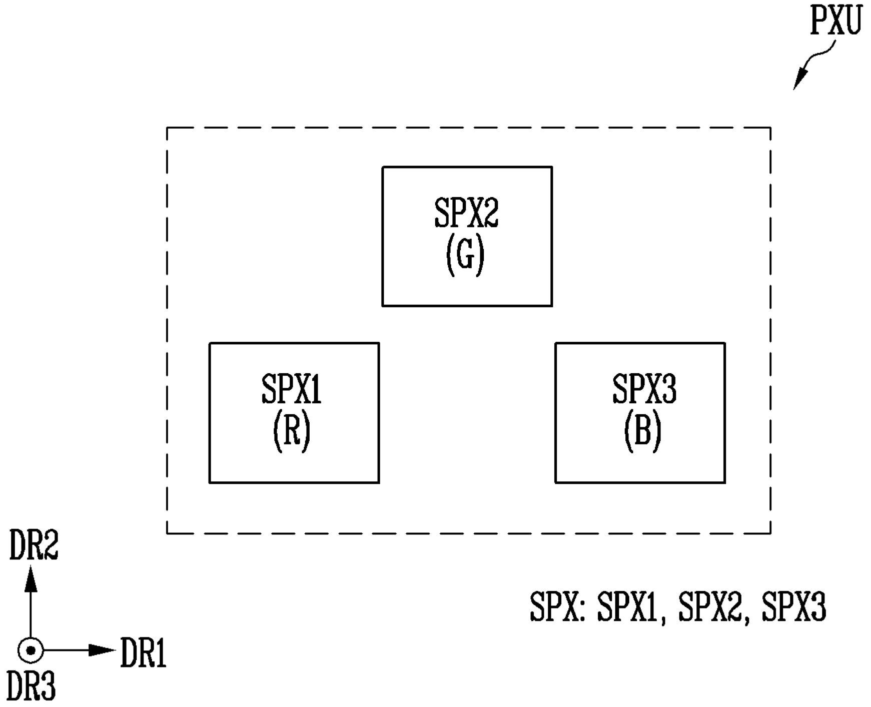
FIGS. 7 to 9 are schematic diagrams illustrating an arrangement structure of sub-pixels according to an embodiment.
Figure 8:
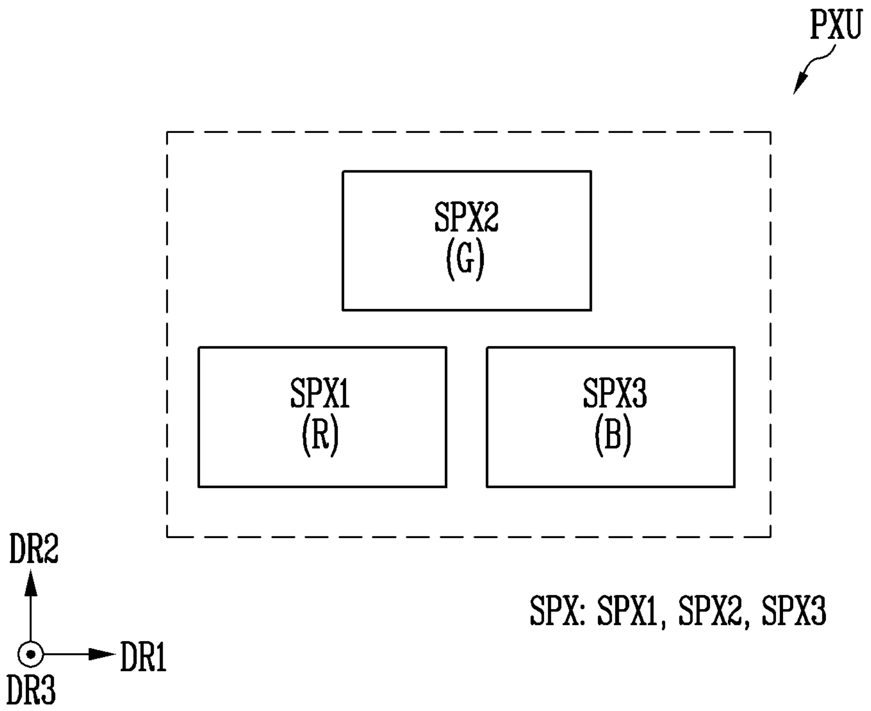
Figure 9:
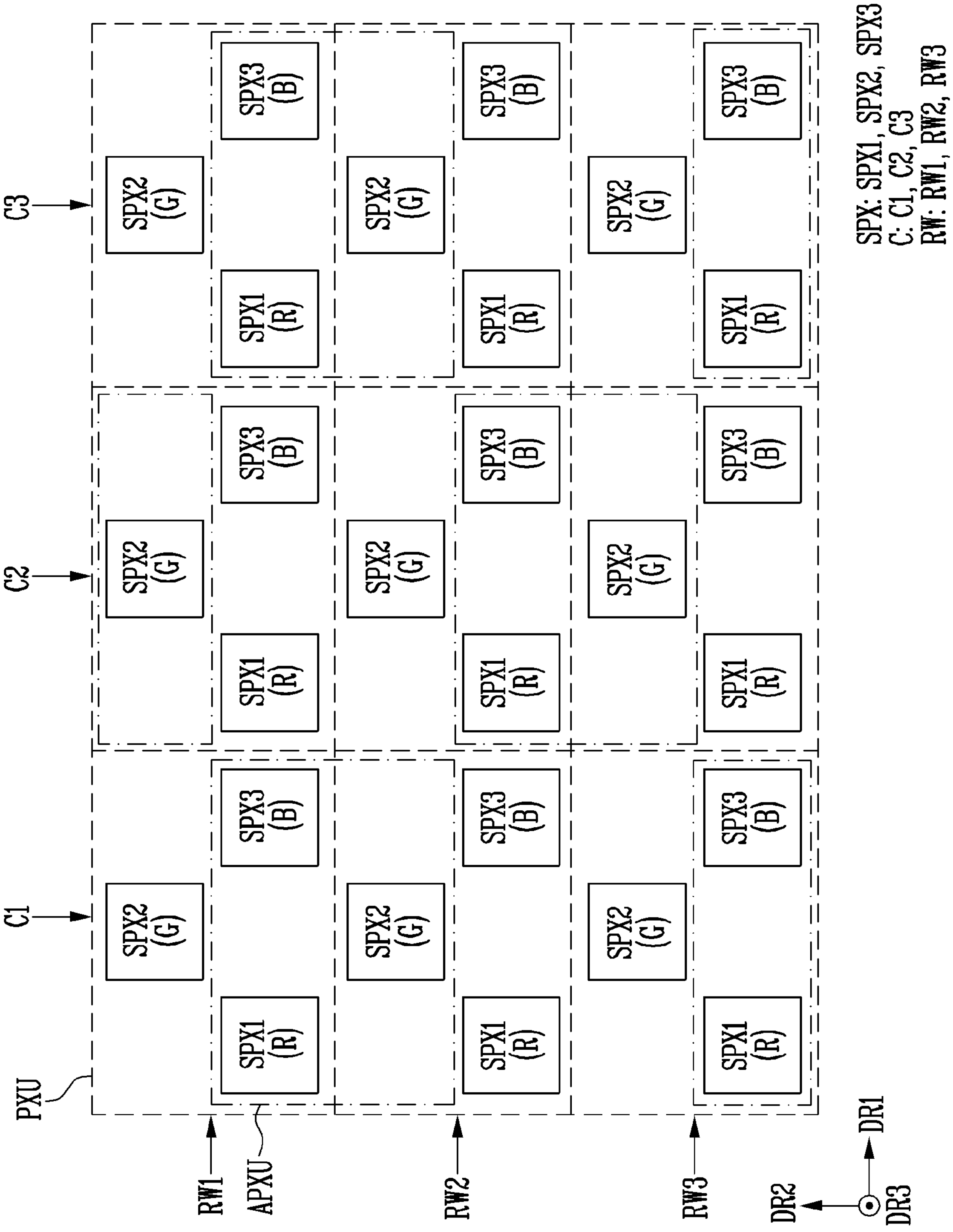

FIGS. 7 to 9 are schematic diagrams illustrating an arrangement structure of sub-pixels according to an embodiment. FIGS. 7 and 8 may schematically show one pixel part PXU, and FIG. 9 may schematically show nine pixel parts PXU.

In a following positional relationship, a characteristic of the sub-pixels SPX may be defined based on the sub-pixel area SPXA. In another embodiment, in the following positional relationship, the characteristic of the sub-pixels SPX may be defined based on the anode electrode (for example, the first electrode ELT1) of each of the sub-pixels SPX.

Referring to FIGS. 7 and 8, the first sub-pixel SPX1 may be a red sub-pixel R. The second sub-pixel SPX2 may be a green sub-pixel G. The third sub-pixel SPX3 may be a blue sub-pixel B.

The first sub-pixel SPX1, the second sub-pixel SPX2, and the third sub-pixel SPX3 may be arranged according to one structure to form the pixel part PXU.

The first sub-pixel SPX1 and the third sub-pixel SPX3 may overlap in the first direction DR1. The first sub-pixel SPX1 and the third sub-pixel SPX3 may be spaced apart from each other in the first direction DR1.

The second sub-pixel SPX2 may be spaced apart from the first sub-pixel SPX1 and the third sub-pixel SPX3 in the second direction DR2. According to an embodiment, the second sub-pixel SPX2 may not overlap the first sub-pixel SPX1 and the third sub-pixel SPX3 in the first direction DR1.

According to an embodiment (refer to FIG. 8), the second sub-pixel SPX2 may overlap in the second direction DR2. However, the disclosure is not limited thereto. For example (refer to FIG. 7), the second sub-pixel SPX2 may not overlap in the second direction DR2.

According to an embodiment, the sub-pixels SPX may be arranged according to a matrix structure based on pixel rows RW in the first direction DR1 and pixel columns C in the second direction DR2. The pixel rows RW may include a first pixel row RW1, a second pixel row RW2, and a third pixel row RW3. The pixel columns C may include a first pixel column C1, a second pixel column C2, and a third pixel column C3.

According to an embodiment, the sub-pixels SPX disposed in one pixel row RW and one pixel column C may form one pixel part PXU. A range of the pixel part PXU is indicated by equally spaced dotted line boxes in FIG. 9.

The pixel part PXU may implement light of various colors by adjusting a luminance of light emitted for each of the sub-pixels SPX. According to an embodiment, a luminance of light emitted from each of the first to third sub-pixels SPX1, SPX2, and SPX3 in one pixel part PXU may be adjusted.

According to an embodiment, the first sub-pixel SPX1 and the third sub-pixel SPX3 disposed in one pixel row RW may form an additional pixel part APXU with the second sub-pixel SPX2 disposed in another adjacent pixel row RW. A range of the additional pixel part PXU is indicated by a dashed-dotted line box in FIG. 9.

The sub-pixels SPX, which are portions of each of the pixel parts PXU adjacent to each other, may form the additional pixel part APXU that functions as one pixel part.

For example, in each of the pixel columns C, the first sub-pixel SPX1 and the third sub-pixel SPX3 of the first pixel row RW1 and the second sub-pixel SPX2 of the second pixel row RW2 may form the additional pixel part APXU.

According to an embodiment, the pixel circuits PXC of each of the sub-pixels SPX disposed in the same pixel row RW may be electrically connected to the same scan line SL. For example, the scan line SL corresponding to the first pixel row RW1 may be electrically connected to the pixel circuits PXC disposed in the first pixel row RW1. The scan line SL corresponding to the second pixel row RW2 may be electrically connected to the pixel circuits PXC disposed in the second pixel row RW2. The scan line SL corresponding to the third pixel row RW3 may be electrically connected to the pixel circuits PXC disposed in the third pixel row RW3.

According to an embodiment, the pixel circuits PXC for the sub-pixels SPX forming the additional pixel part APXU may be electrically connected to different scan lines SL, respectively. For example, the pixel circuits PXC of each of the first sub-pixel SPX1 and the third sub-pixel SPX3 of the first pixel row RW1 may be electrically connected to the scan line SL corresponding to the first pixel row RW1, and the pixel circuit PXC of the second sub-pixel SPX2 of the second pixel row RW2 may be electrically connected to the scan line SL corresponding to the second pixel row RW2.

According to an embodiment, in order for the additional pixel part APXU to function as one pixel part (for example, for the additional pixel part APXU to display a white box), directions of voltages supplied to the data lines DL for the sub-pixels SPX in the additional pixel part APXU may be defined differently from each other.

Experimentally, a risk of excessive formation of a parasitic capacitance to some of the data lines DL may occur. However, according to an embodiment, some data lines DL (for example, the second data line DL2) of which voltage directions of the data signals are different may not be disposed between other data lines DL (for example, the first data line DL1 and the third data line DL3), and thus a concern that an electrical signal may be distorted due to formation of the parasitic capacitance may be reduced. Details regarding this is described later with reference to drawings after FIG. 13.

A structure of some electrodes of the pixel-circuit layer PCL and the light-emitting-element layer EML is described with reference to FIGS. 10 to 12.

In the following drawing, layers identical to the layers described above with reference to FIG. 6 (for example, formed or patterned in the same process) may be expressed in the same pattern.

Figure 10:
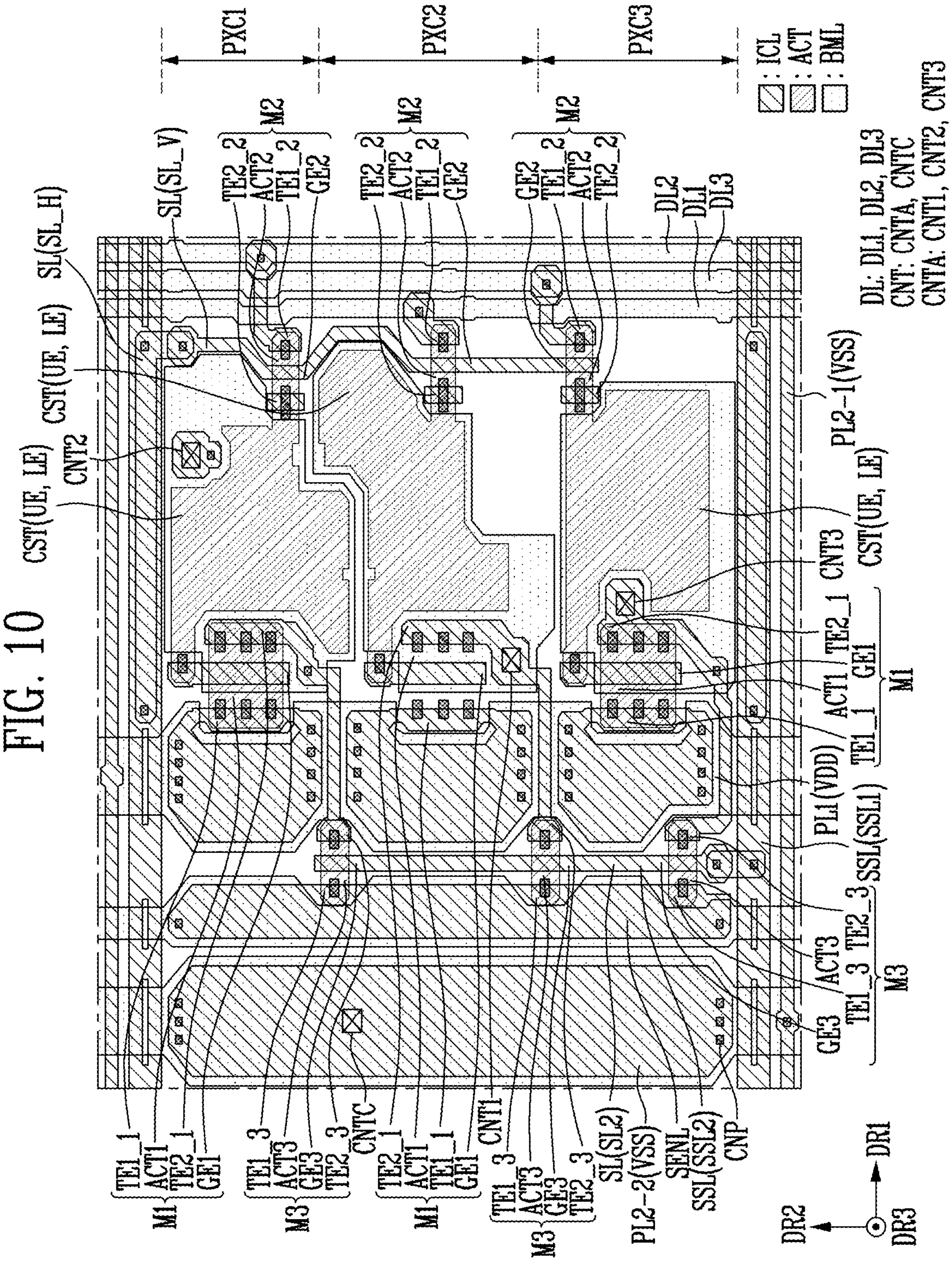
FIGS. 10 and 11 are schematic plan views illustrating an electrode structure according to an embodiment.
Figure 11:
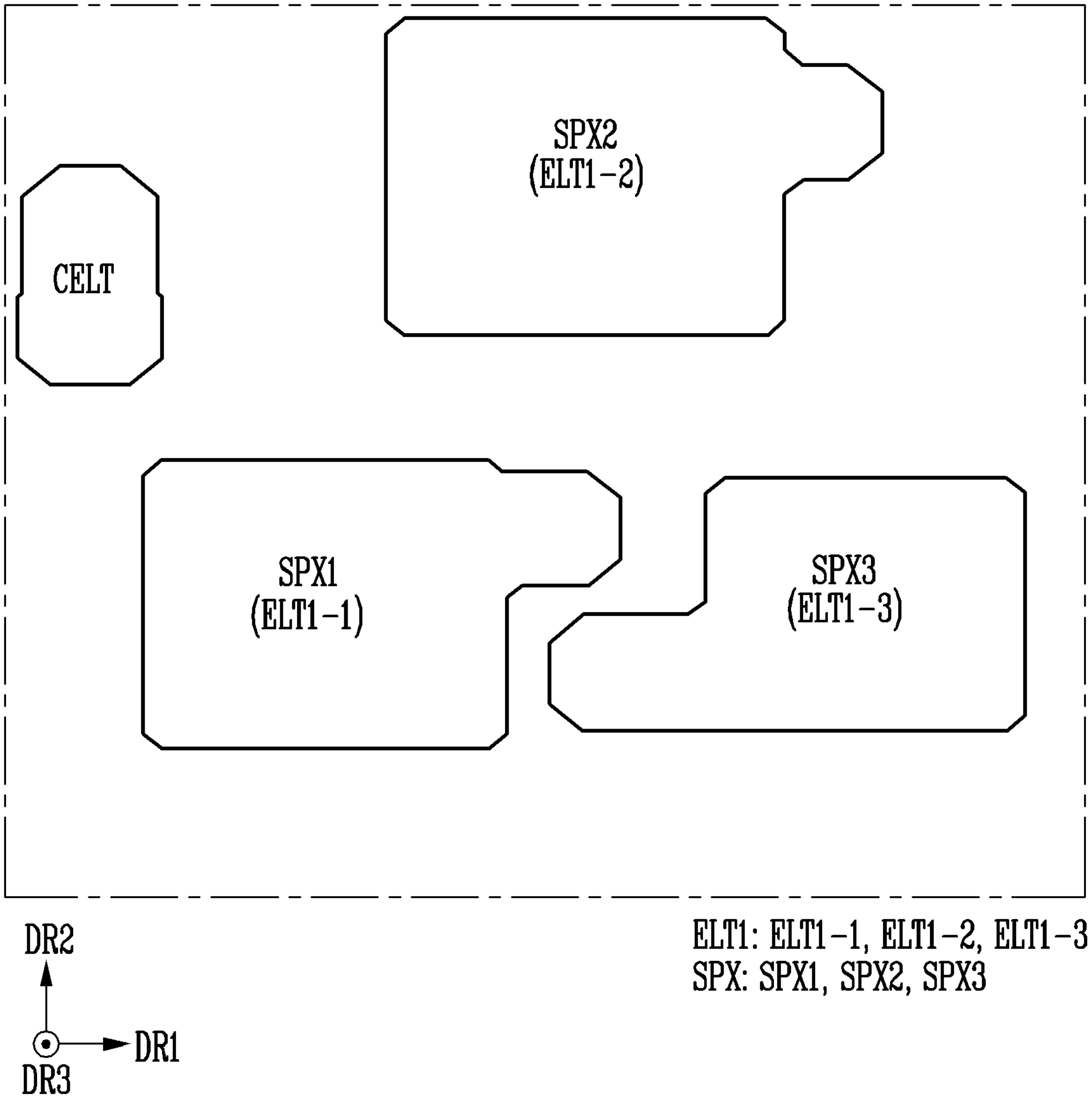

FIGS. 10 and 11 are schematic plan views illustrating an electrode structure according to an embodiment. FIG. 12 is a schematic diagram illustrating a connection structure between a pixel circuit and lines according to an embodiment. FIG. 10 shows the lower auxiliary electrode layer BML, the active layer ACT, and the interlayer conductive layer ICL. In order to clearly describe a position of the first electrode ELT1 and the connection electrode CELT of the light emitting element LD, FIG. 11 shows an anode contact portion CNTA and a cathode contact portion CNTC and does not show the lower auxiliary electrode layer BML, the active layer ACT, and the interlayer conductive layer ICL. FIG. 12 schematically shows a connection relationship between the pixel circuit PXC and lines. FIG. 12 shows a connection relationship between configurations shown in FIG. 10. Referring to FIGS. 10 to 12 together, a position and an electrical connection relationship of respective configurations will be clearly understood.

In FIGS. 10 and 11, the contact portion CNT is shown to have a shape marked with an X in a quadrangular shape. The contact portion CNT may be a structure formed on the protective layer PSV (for example, passing through the protective layer PSV), and may be a connection member between a conductive layer in the pixel-circuit layer PCL and a conductive layer in the light-emitting-element layer EML.

According to an embodiment, the contact portion CNT may include the anode contact portion CNTA and the cathode contact portion CNTC. The anode contact portion CNTA may include a first contact portion CNT1, a second contact portion CNT2, and a third contact portion CNT3.

In FIGS. 10 and 11, contact members CNP for electrically connecting different patterns (for example, the lower auxiliary electrode layer BML, the active layer ACT, and the interlayer conductive layer ICL) is shown to have a shape marked with an X in a quadrangular shape.

According to an embodiment, the pixel circuits PXC and lines connected to the pixel circuits PXC may be disposed (or patterned).

For example, the pixel circuit PXC may include the first pixel circuit PXC1, the second pixel circuit PXC2, and the third pixel circuit PXC3. Each of the first pixel circuit PXC1, the second pixel circuit PXC2, and the third pixel circuit PXC3 includes the first transistor M1, the second transistor M2, the third transistor M3, and the storage capacitor CST.

The first pixel circuit PXC1, the second pixel circuit PXC2, and the third pixel circuit PXC3 may be spaced apart from each other in the second direction DR2.

Each of the first pixel circuit PXC1, the second pixel circuit PXC2, and the third pixel circuit PXC3 may be the pixel circuit PXC for the respective sub-pixels SPX different from each other. For example, the first pixel circuit PXC1 may be the pixel circuit PXC for the first sub-pixel SPX1. The second pixel circuit PXC2 may be the pixel circuit PXC for the second sub-pixel SPX2. The third pixel circuit PXC3 may be the pixel circuit PXC for the third sub-pixel SPX3.

According to an embodiment, the first transistor electrode may include a (1-1)-th transistor electrode TE1_1, a (1-2)-th transistor electrode TE1_2, and a (1-3)-th transistor electrode TE1_3, and may be a source electrode or a drain electrode. The second transistor electrode may include a (2_1)-th transistor electrode TE2_1, a (2_2)-th transistor electrode TE2_2, and a (2_3)-th transistor electrode TE2_3, and may be a drain electrode or a source electrode.

According to an embodiment, the first transistor M1 of each of the first pixel circuit PXC1, the second pixel circuit PXC2, and the third pixel circuit PXC3 may include a first gate electrode GE1, a (1_1)-th transistor electrode TE1_1, a (2_1)-th transistor electrode TE2_1, and a first active layer ACT1.

According to an embodiment, the second transistor M2 of each of the first pixel circuit PXC1, the second pixel circuit PXC2, and the third pixel circuit PXC3 may include a second gate electrode GE2, a (1_2)-th transistor electrode TE1_2, a (2_2)-th transistor electrode TE2_2, and a second active layer ACT2.

According to an embodiment, the third transistor M3 of each of the first pixel circuit PXC1, the second pixel circuit PXC2, and the third pixel circuit PXC3 may include a third gate electrode GE3, a (1_3)-th transistor electrode TE1_3, a (2_3)-th transistor electrode TE2_3, and a third active layer ACT3.

The storage capacitor CST may include an upper electrode UE and a lower electrode LE. According to an embodiment, the upper electrode UE may be formed of the active layer ACT, and the lower electrode LE may be formed by the lower auxiliary electrode layer BML. However, the disclosure is not limited to the above-described example. According to an embodiment, the upper electrode UE may be formed by one or more of layers (for example, the interlayer conductive layer ICL and the like) disposed above the lower auxiliary electrode layer BML.

According to an embodiment, the storage capacitor CST of the first pixel circuit PXC1, the storage capacitor CST of the second pixel circuit PXC2, and the storage capacitor CST of the third pixel circuit PXC3 may be sequentially disposed on the direction DR2.

Among the scan lines SL, the first extension scan line SL_H may extend in the first direction DR1. Among the scan lines SL, the second extension scan line SL_V may extend in the second direction DR2. The first extension scan line SL_H and the second extension scan line SL_V may be formed by one conductive layer(s). For example, the first extension scan line SL_H and the second extension scan line SL_V may be formed by the interlayer conductive layer ICL.

The data lines DL may extend in the second direction DR2. The data lines DL may be spaced apart from each other in the first direction DR1. The data lines DL may include the first data line DL1, the second data line DL2, and the third data line DL3.

The first data line DL1 may be a data line for the first pixel circuit PXC1 and may be electrically connected to the (1_2)-th transistor electrode TE1_2 of the second transistor M2 of the first pixel circuit PXC1. The second data line DL2 may be a data line for the second pixel circuit PXC2 and may be electrically connected to the (1_2)-th transistor electrode TE1_2 of the second transistor M2 of the second pixel circuit PXC2. The third data line DL3 may be a data line for the third pixel circuit PXC3 and may be electrically connected to the (1_2)-th transistor electrode TE1_2 of the second transistor M2 of the third pixel circuit PXC3.

As described above, the second data line DL2 may be a line for forming the second sub-pixel SPX2, which is a red sub-pixel, and may not be disposed between the first data line DL1 and the third data line DL3.

The sensing line SENL may extend in the second direction DR2. The sensing line SENL may be electrically connected to the (1_3)-th transistor electrode TE1_3 of the third transistor M3 of the first to third pixel circuits PXC1, PXC2, and PXC3. The sensing line SENL may be formed by the lower auxiliary electrode layer BML and the interlayer conductive layer ICL.

The first power line PL1 receiving power from the first power VDD may extend in the second direction DR2, and may be electrically connected to the (1-1)-th transistor electrode TE1_1 of the first transistor M1 of the first to third pixel circuits PXC1, PXC2, and PXC3. The first power line PL1 may be formed by the lower auxiliary electrode layer BML and the interlayer conductive layer ICL.

The first power line PL1 may be electrically connected to the anode electrode (for example, the first electrode ELT1) of each sub-pixel SPX through the first transistor M1 and the anode contact portion CNTA. The first electrode ELT1 may include a (1-1)-th electrode ELT1-1 included in the first sub-pixel SPX1, a (1-2)-th electrode ELT1-2 included in the second sub-pixel SPX2, and a (1-3)-th electrode ELT1-3 included in the third sub-pixel SPX3.

The first contact portion CNT1 may be electrically connected to the (1-1)-th electrode ELT1-1 of the first sub-pixel SPX1. The second contact portion CNT2 may be electrically connected to the (1_2)-th electrode ELT1-2 of the second sub-pixel SPX2. The third contact portion CNT3 may be electrically connected to the (1-3)-th electrode ELT1-3 of the third sub-pixel SPX3.

The second power line PL2 receiving power from the second power VSS may include a (2-1)-th power line PL2-1 extending in the first direction DR1 and a (2-2)-th power line PL2-2 extending in the second direction DR2. The (2-1)-th power line PL2-1 and the (2-2)-th power line PL2-2 may be electrically connected through one contact member CNP. According to an embodiment, the (2-1)-th power line PL2-1 may be formed by the interlayer conductive layer ICL, and the (2-2)-th power line PL2_2 may be formed by the lower auxiliary electrode layer BML and the interlayer conductive layer ICL.

The second power line PL2 may be electrically connected to the connection electrode CELT through the cathode contact portion CNTC. The connection electrode CELT may be electrically connected to the second electrode ELT2, which is the cathode electrode of the light emitting element LD, through a separately provided contact structure CH. Although not shown in the drawing, according to an embodiment, the second electrode ELT2 may be disposed on an entire surface of the display area DA.

The first electrode ELT1 may be an anode electrode of each of the first to third sub-pixels SPX1, SPX2, and SPX3. Accordingly, the first electrode ELT1 of each of the first to third sub-pixels SPX1, SPX2, and SPX3 may be spaced apart from each other to receive an anode signal from each of the first to third pixel circuits PXC1, PXC2, and PXC3.

The first electrode ELT1 may be electrically connected to the (2-1)-th transistor electrode TE2_1 of the first transistor M1 through the anode contact portion CNTA. Accordingly, the first electrode ELT1 may be configured to receive a driving signal.

The second electrode ELT2 may be a cathode electrode for the sub-pixels SPX. The second electrode ELT2 may be disposed over areas where the sub-pixels SPX are disposed. The connection electrode CELT may be electrically connected to a portion of the second power line PL2 and may be electrically connected to the second electrode ELT2. Accordingly, the second electrode ELT2 may be configured to receive the cathode signal.

A structure displaying an image of a checker pattern and an image of an inverted-checker pattern as one image that the display device 1 may display is described with reference to FIGS. 13 to 18.

FIGS. 13 to 18 are schematic plan views illustrating a structure in which a display device according to an embodiment displays an image.

Figure 13:
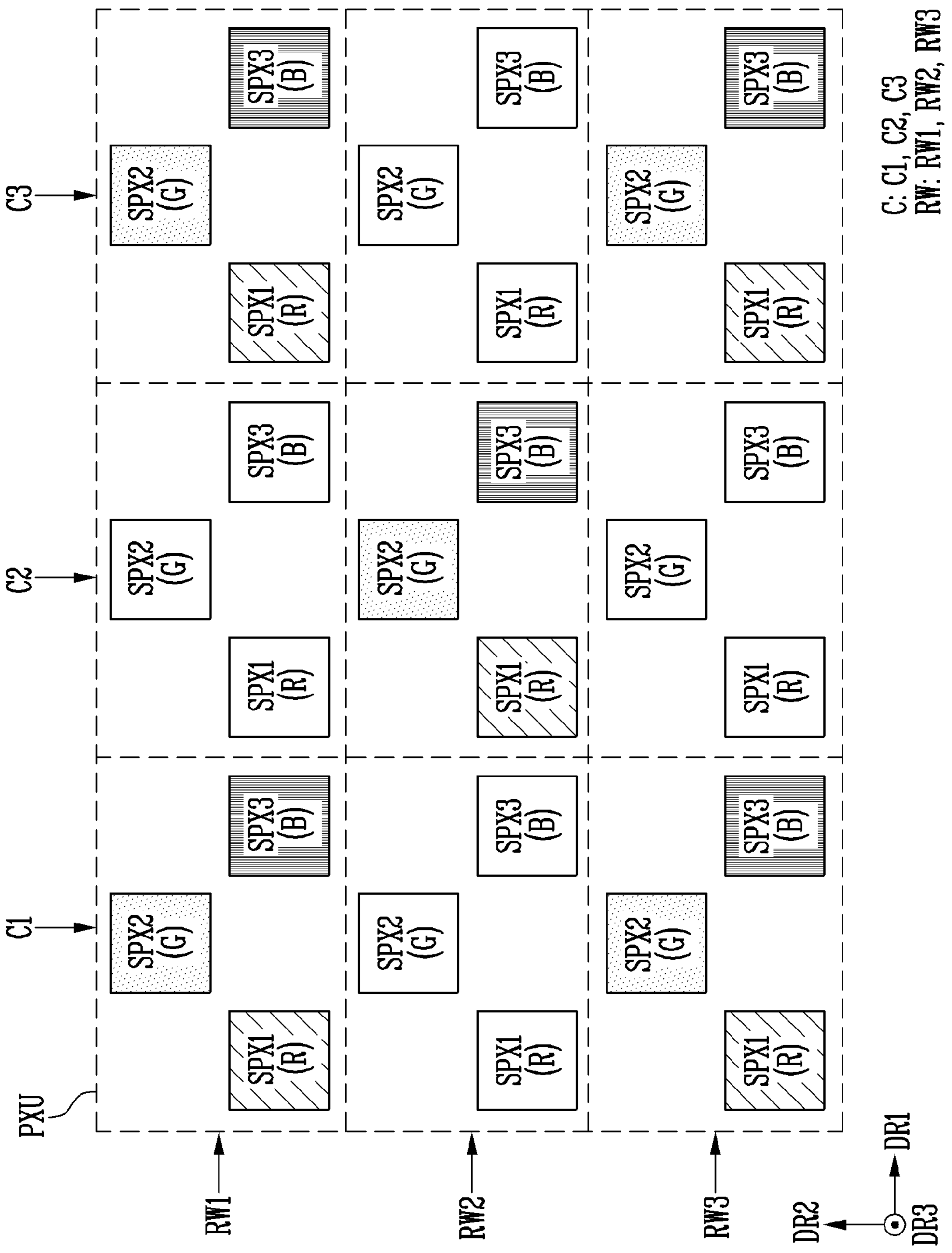
FIGS. 13 to 18 are schematic plan views illustrating a structure in which a display device according to an embodiment displays an image.
Figure 14:
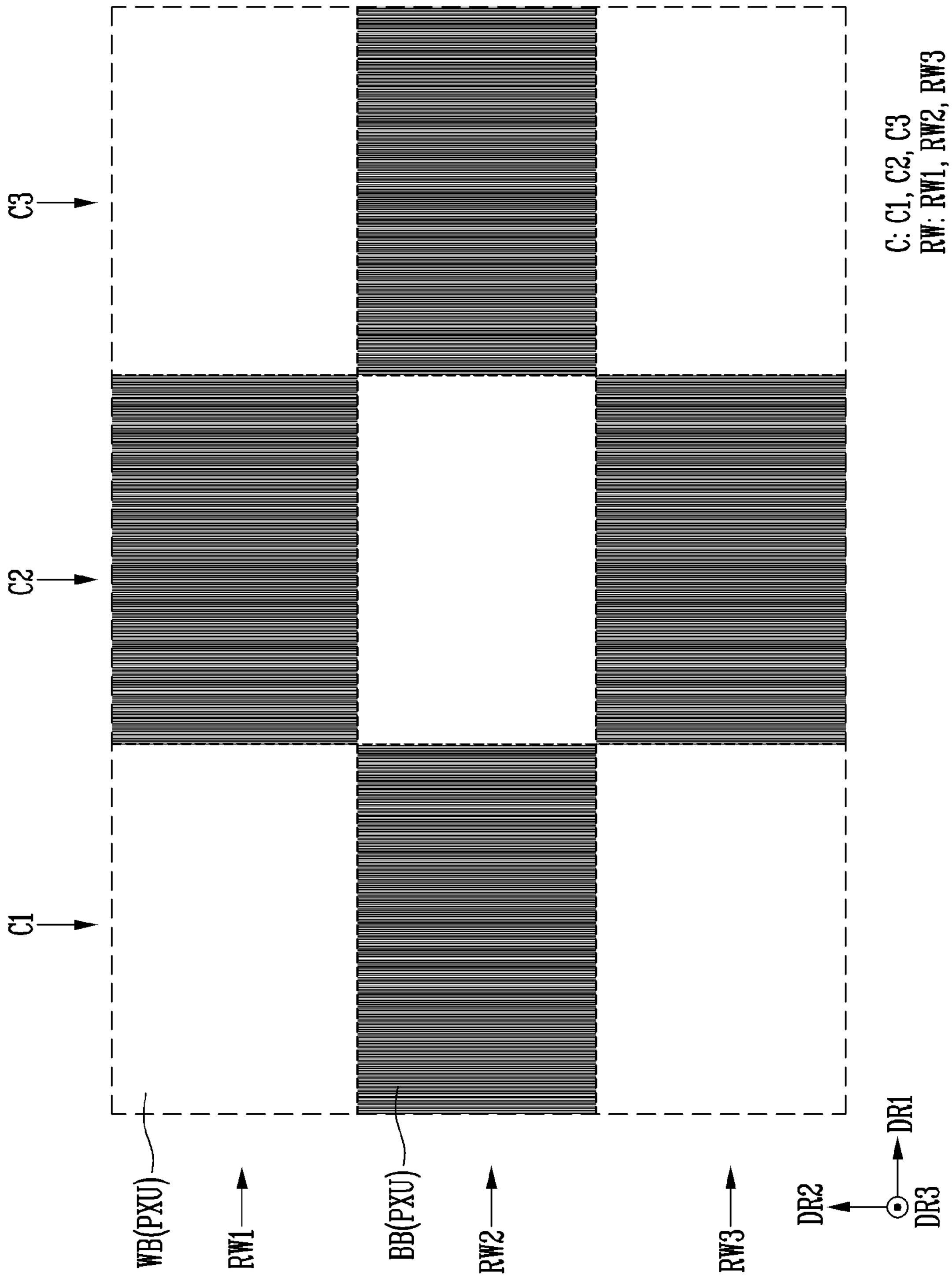
Figure 15:
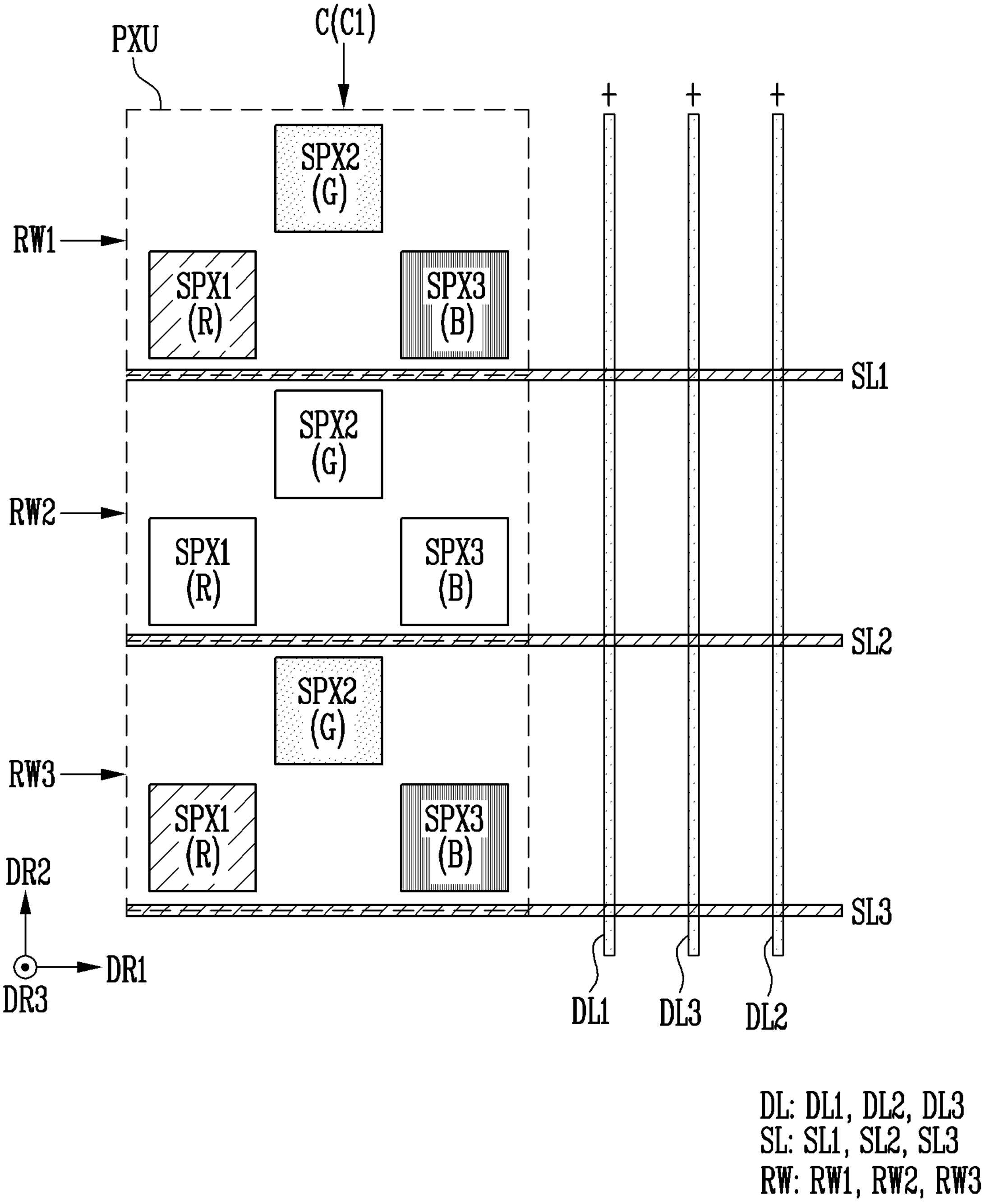
Figure 16:
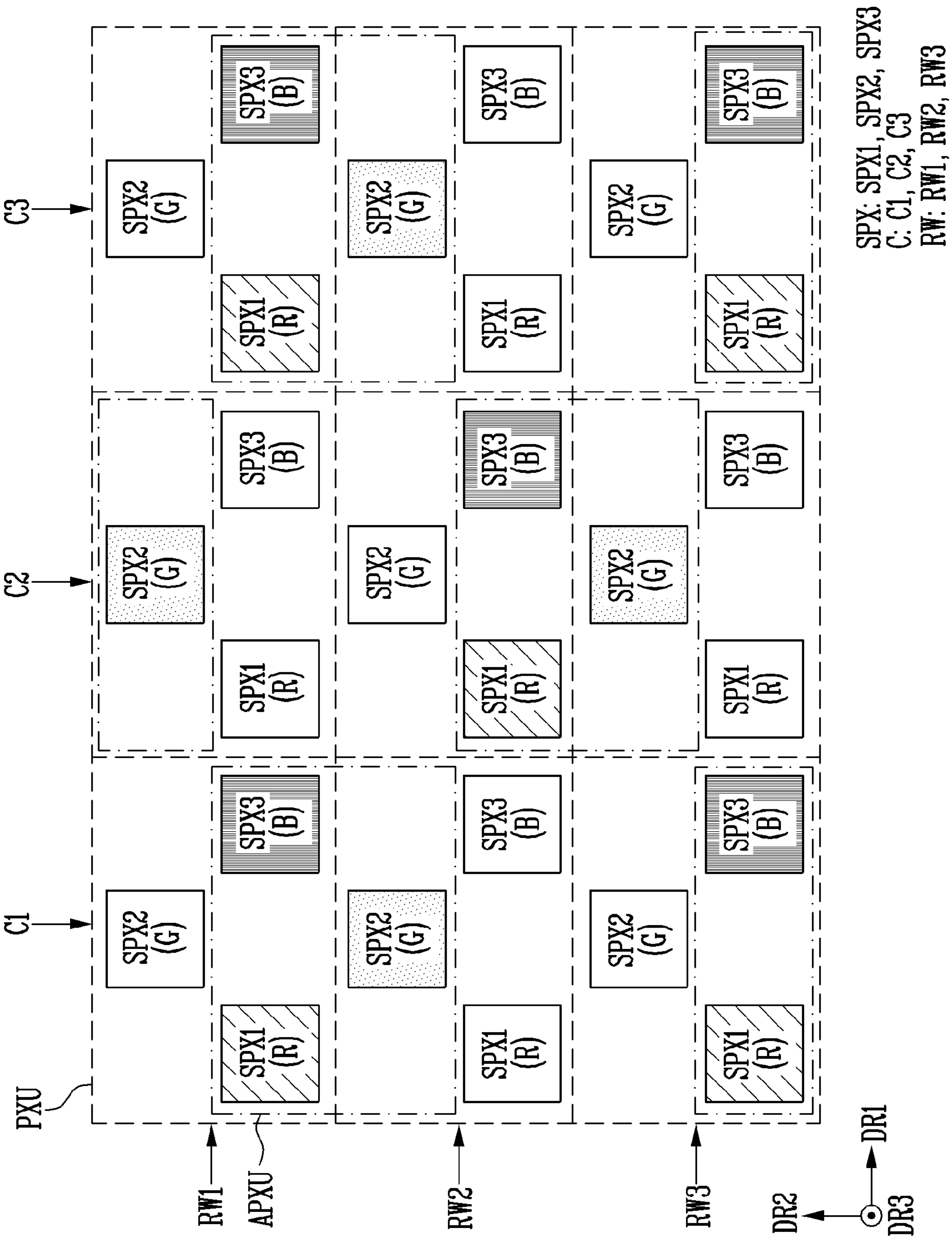
Figure 17:
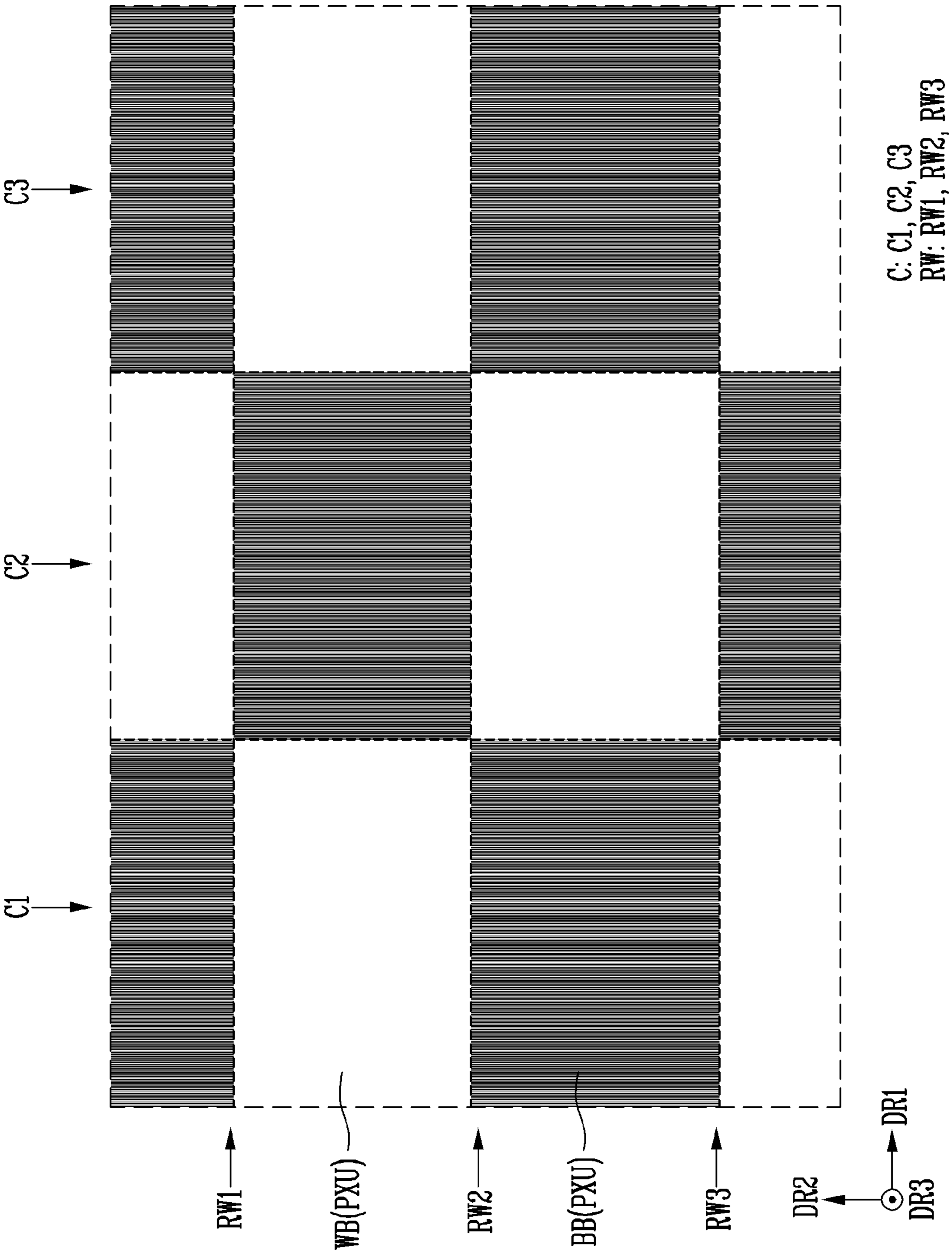
Figure 18:
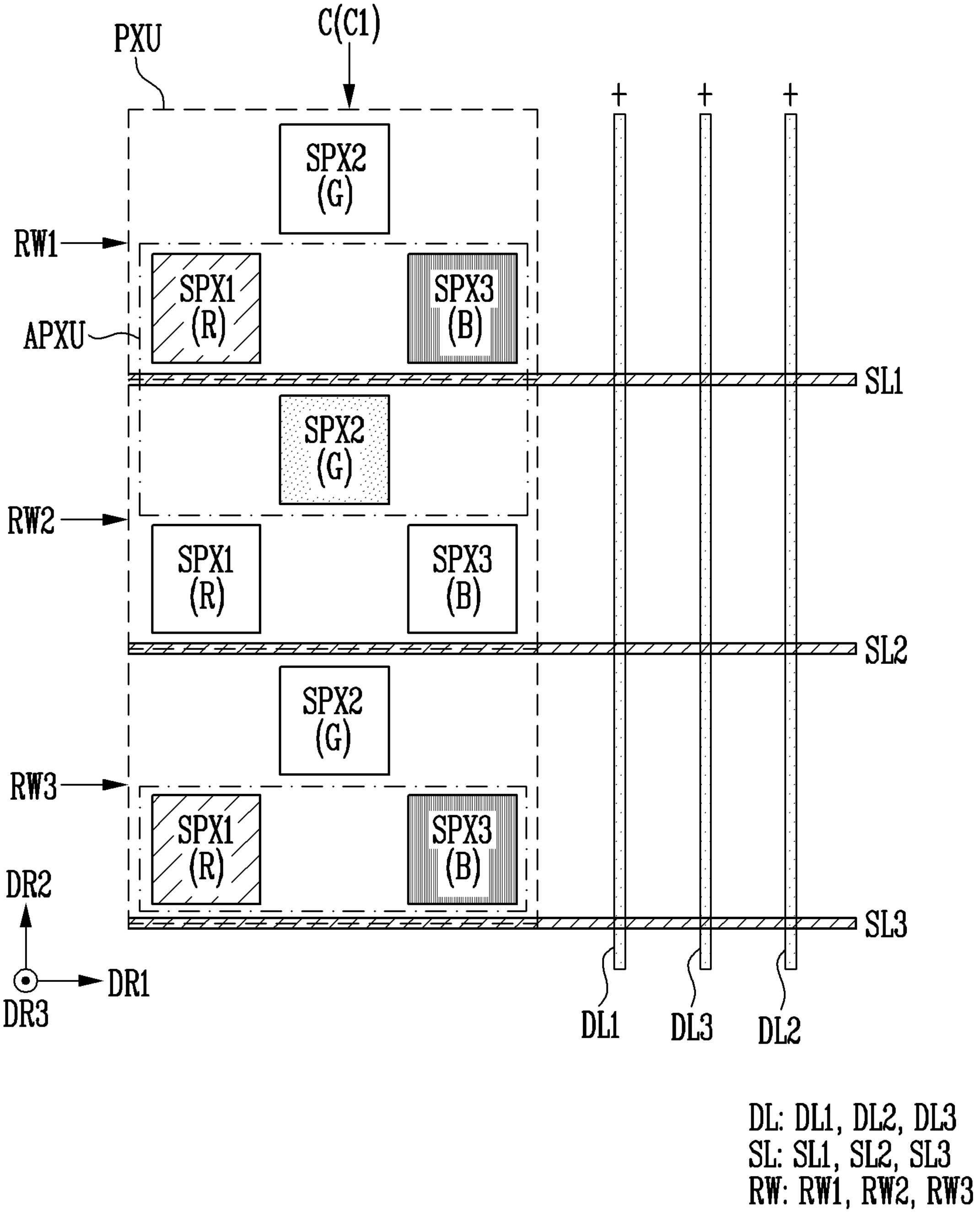

FIGS. 13 to 15 show an embodiment in which the display device 1 displays the image of the checker pattern. FIGS. 16 to 18 show an embodiment in which the display device 1 displays the image of the inverted-checker pattern.

FIGS. 13 and 16 schematically show a structure in which each of the sub-pixels SPX emits light of one color according to an embodiment. FIGS. 14 and 17 schematically show a structure in which an image of a white box and a black box is displayed as the sub-pixels SPX emit light of one color according to an embodiment. FIGS. 15 and 18 schematically show a relationship between the data lines DL and the scan lines SL according to an embodiment.

According to an embodiment, the display device 1 may display the image of the checker pattern and the image of the inverted-checker pattern. For example, a checker pattern and an inverted-checker pattern may be patterns in which a white box WB and a black box BB are alternately disposed on a column direction and a row direction. In the checker pattern and the inverted-checker pattern, the white box WB and the black box BB may be arranged in a matrix structure.

According to an embodiment, the white box WB may be displayed in case that the first sub-pixel SPX1, the second sub-pixel SPX2, and the third sub-pixel SPX3 emit light of a high luminance (for example, a maximum luminance). The black box BB may be displayed in case that the first sub-pixel SPX1, the second sub-pixel SPX2, and the third sub-pixel SPX3 emit light of a low luminance or substantially do not emit light.

First, an embodiment in which the display device 1 displays the image of the checker pattern is described with reference to FIGS. 13 to 15. According to an embodiment, the checker pattern may be a display pattern in which the white box WB is displayed by the pixel part PXU.

According to an embodiment, each of the pixel parts PXU may display the white box WB or the black box BB. For example, the sub-pixel part PXU of the first pixel row RW1 and the first pixel column C1 may display the white box WB, and sub-pixel part PXU of the second pixel row RW2 and the first pixel column C1 may display the black box BB, and the sub-pixel part PXU of the third pixel row RW3 and the first pixel column C1 may display the white box WB.

According to an embodiment, in order for some sub-pixel parts PXU to display the white box WB, the data lines DL may supply data signals to the pixel circuit PXC for each of the sub-pixel parts PXU. At this time, the data lines DL may supply a positive polarity of data signal according to an embodiment. For example, the first data line DL1, the second data line DL2, and the third data line DL3 may supply a positive polarity of data signal to corresponding pixel circuits PXC, respectively.

For example, the pixel circuits PXC of each of the sub-pixels SPX included in the pixel part PXU displaying each of the white box WB and the black box BB may be electrically connected to the same scan line SL. Accordingly, even though a data signal of the same voltage direction is supplied to the sub-pixels SPX for displaying the white box WB, each of the sub-pixels SPX may normally emit light of a high luminance. According to an embodiment, the scan line SL may include a first scan line SL1 disposed to correspond to the first pixel row RW1, a second scan line SL2 disposed to correspond to the second pixel row RW2, and a third scan line SL3 disposed to correspond to the third pixel row RW3. All of the pixel circuits PXC for the sub-pixels SPX disposed in the first pixel row RW1 may be electrically connected to the first scan line SL1, all of the pixel circuits PXC for the sub-pixels SPX disposed in the second pixel row RW2 may be electrically connected to the second scan line SL2, and all of the pixel circuits PXC for the sub-pixels SPX disposed in the third pixel row RW3 may be electrically connected to the third scan line SL3.

An embodiment in which the display device 1 displays the image of the inverted-checker pattern is described with reference to FIGS. 16 to 18. The inverted-checker pattern may be a display pattern in which the white box WB is displayed by the additional pixel part PXU.

According to an embodiment, each of the additional pixel parts APXU may display the white box WB or the black box BB. According to an embodiment, a portion of the pixel part PXU may be a portion of the additional pixel part PXU for displaying the black box BB, and another portion of the pixel part PXU may be a portion of the additional pixel part PXU for displaying the white box WB. For example, a portion of the pixel part PXU of the first pixel row RW1 and the first pixel column C1 and a portion of the pixel part PXU of the second pixel row RW2 and the first pixel column C1 may display the white box WB, and a portion of the pixel part PXU of the second pixel row RW2 and the first pixel column C1 and a portion of the pixel part PXU of the third pixel row RW3 and the first pixel column C1 may display the black box BB.

According to an embodiment, in order for the additional pixel part APXU to display the white box WB, the data lines DL may supply the data signals to the pixel circuit PXC for each of the sub-pixel parts PXU. At this time, a portion of the data lines DL may supply a positive polarity of data signal, and another portion of the data lines DL may supply a negative polarity of data signal. For example, the first data line DL1 and the third data line DL3 may supply the positive polarity of data signal to corresponding pixel circuits PXC, respectively. The second data line DL2 may supply the negative polarity of data signal to a corresponding pixel circuit PXC.

For example, the pixel circuit PXC of each of the first sub-pixel SPX1 and the third sub-pixel SPX3 and the pixel circuit PXC of the second sub-pixel SPX2 forming the additional pixel part APXU may be electrically connected to different scan lines SL, respectively. As described above, since a portion of one pixel part PXU may include the sub-pixel SPX for forming the white box WB, and another portion may include the sub-pixel SPX for forming the black box BB, a portion of the sub-pixels SPX of one pixel part PXU may be required to be charged with a data voltage to emit light of a high luminance, and a data signal may be required to be defined such that another portion of the sub-pixel SPX substantially does not emit light. Accordingly, a positive polarity of data voltage may be supplied to a portion of the data lines DL, and a negative polarity of data voltage may be supplied to another portion of the data line DL.

For example, in case that the display device 1 displays the image of the inverted-checker pattern, the first data line DL1 and the third data line DL3 electrically connected to the pixel circuit PXC of each of the first sub-pixel SPX1 and the third sub-pixel SPX3 of the first pixel row RW1 and the first pixel column C1 may supply the positive polarity of data voltage, and the second data line DL2 electrically connected to the pixel circuit PXC of the second sub-pixel SPX2 of the first pixel row RW1 and the first pixel column C1 may supply the negative polarity of data voltage. Similarly, in the second pixel row RW2 and the first pixel column C1, the data signals for the first sub-pixel SPX1 and the third sub-pixel SPX3 and the data signals for the second sub-pixel SPX2 may be defined as data voltages of different directions.

As a result, in case that the display device 1 displays the image of inverted-checker pattern, data voltages of different directions may be supplied to a portion of the data lines DL. Experimentally, in case that three different data lines DL are disposed, in a case where one data line DL supplied with voltages of different directions is disposed between other data lines DL, as voltage directions of electrical signals are different, a parasitic capacitance may excessively greatly occur. However, according to an embodiment, the second data line DL2 supplied with data signals of different voltage directions may not be disposed between the first data line DL1 and the third data line DL3. Accordingly, even in a case where the display device 1 displays the image of the inverted-checker pattern, a risk of damage to reliability of an electrical signal due to a parasitic capacitance between the data lines DL may be reduced. For example, in case that a parasitic capacitance excessively occurs, a data charging rate in the storage capacitor CST according to the data signal supplied from the second data line DL2 may not be sufficient. In case that a data charging rate corresponding to the green sub-pixel is not sufficiently secured, implementing an intended color may be difficult (for example, a magentish phenomenon). The above-described risk may occur more significantly in an edge area of the display area DA in which the sub-pixel SPX is formed. For example, at one edge (for example, an upper side) of the display area DA, the second sub-pixel SPX2, which is the green sub-pixel, may be disposed at an outermost portion, and thus a concern that an influence on the data charging rate of the second sub-pixel SPX2 is more greatly recognized may exist. However, according to an embodiment, since a disposition of the second data line DL2 for the green sub-pixel is uniquely designed, the data charging rate may be sufficiently secured, and thus the above-described risks may be prevented.

A display device 1 according to another embodiment is described with reference to FIGS. 19 to 24. Description that is redundant to the above-described content is only briefly described or is not repeated.

The display device 1 according to an embodiment may be different from the display device 1 according to an earlier discussed embodiment, at least in that the second data line DL2 may not be disposed between the first data line DL1 and the third data line DL3, and the first sub-pixel SPX1, the second sub-pixel SPX2, and the third sub-pixel SPX3 may be spaced apart from each other in an oblique direction (for example, in a first oblique direction SDR1 and a second oblique direction SDR2).

Figure 19:
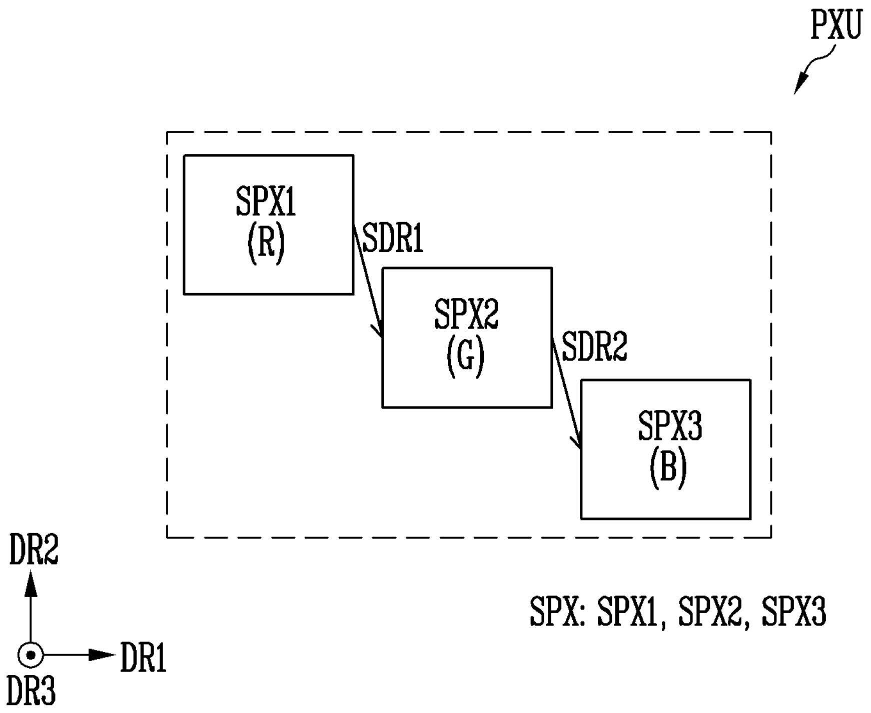
FIGS. 19 and 20 are schematic diagrams illustrating an arrangement structure of sub-pixels according to an embodiment.
Figure 20:
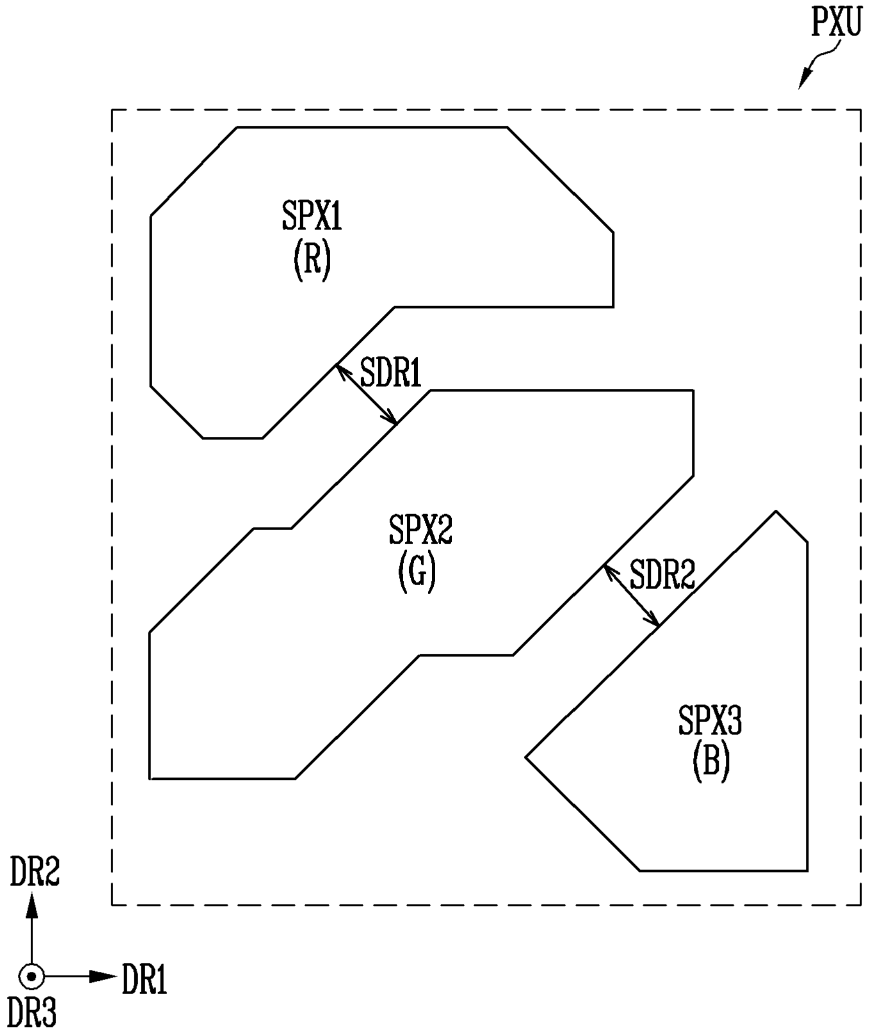

FIGS. 19 and 20 are schematic diagrams illustrating an arrangement structure of sub-pixels according to an embodiment. FIGS. 19 and 20 may schematically show one pixel part PXU. The pixel part PXU according to an embodiment may be arranged according to a matrix structure based on pixel rows RW in the first direction DR1 and pixel columns C in the second direction DR2.

Referring to FIGS. 19 and 20, according to an embodiment, the sub-pixels SPX may be spaced apart from each other in an oblique direction. The oblique direction may be a direction different from the first direction DR1, which is the pixel row RW direction, and the second direction DR2, which is the pixel column C direction. For example, the oblique direction may be the first oblique direction SDR1 or the second oblique direction SDR2.

The first sub-pixel SPX1 and the second sub-pixel SPX2 may be spaced apart from each other in the first oblique direction SDR1. The second sub-pixel SPX2 and the third sub-pixel SPX3 may be spaced apart from each other in the second oblique direction SDR2. Accordingly, the first to third sub-pixels SPX1 to SPX3 may be sequentially arranged generally on the oblique direction.

According to embodiments, sizes of the first to third sub-pixels SPX1 to SPX3 may be generally uniform, and according to an embodiment, the size of the second sub-pixel SPX2 may be greater than the size of the first sub-pixel SPX1 and the size of the third sub-pixel SPX3. According to an embodiment, edges of one side of the first sub-pixel SPX1 and the second sub-pixel SPX2 may overlap each other in the second direction DR2.

According to the arrangement of the sub-pixels SPX described above, color quality in an edge area of the display area DA may be improved. For example, according to the arrangement of the sub-pixels SPX described above, in case that the display device 1 displays the white box WB in the edge area of the display area DA, as a sub-pixel SPX of a partial color is not sufficiently displayed, a risk that an unintended color is observed may be prevented. In particular, a kick-back phenomenon during driving of the sub-pixels SPX may have a greater influence on the edge area of the display area DA, but such risk may be reduced by the oblique arrangement of the sub-pixels SPX.

As the data lines DL have a unique structural characteristic while the color quality of the sub-pixels SPX is improved according to the above-described arrangement structure, a technical effect of suitably performing line repair may be provided. Hereinafter, an electrode arrangement structure capable of suitably performing a line repair process is described with reference to FIGS. 21 to 23.

Figure 21:
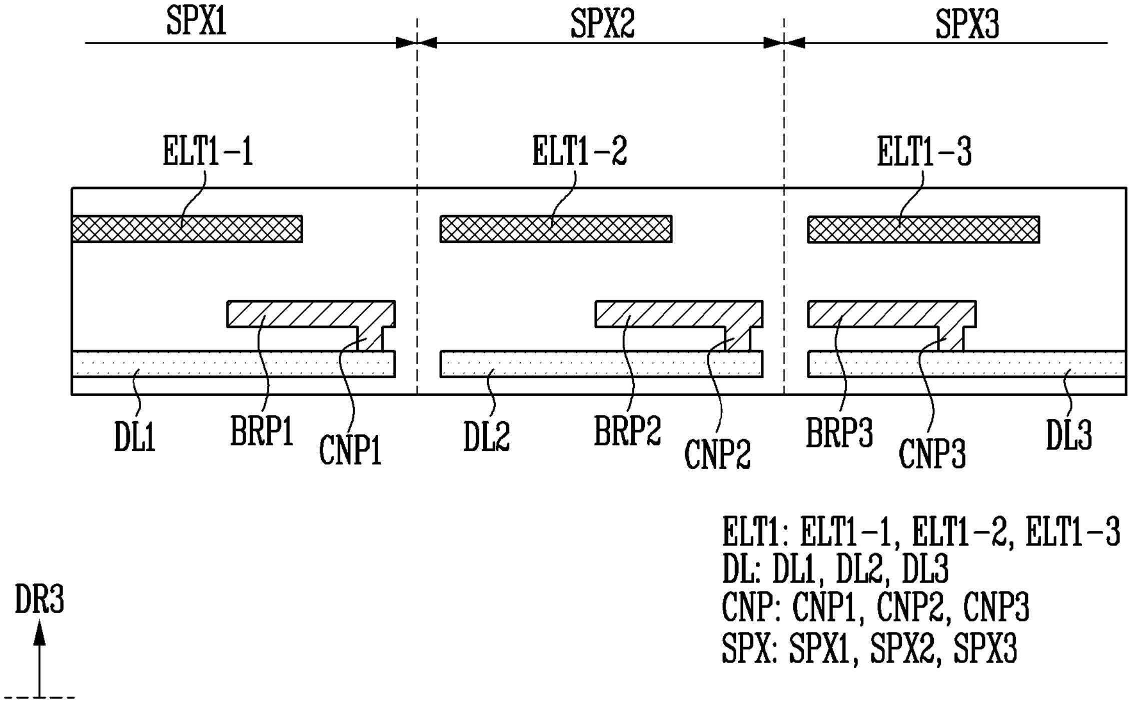
FIG. 21 is a schematic cross-sectional view illustrating an electrode structure according to an embodiment.
Figure 22:
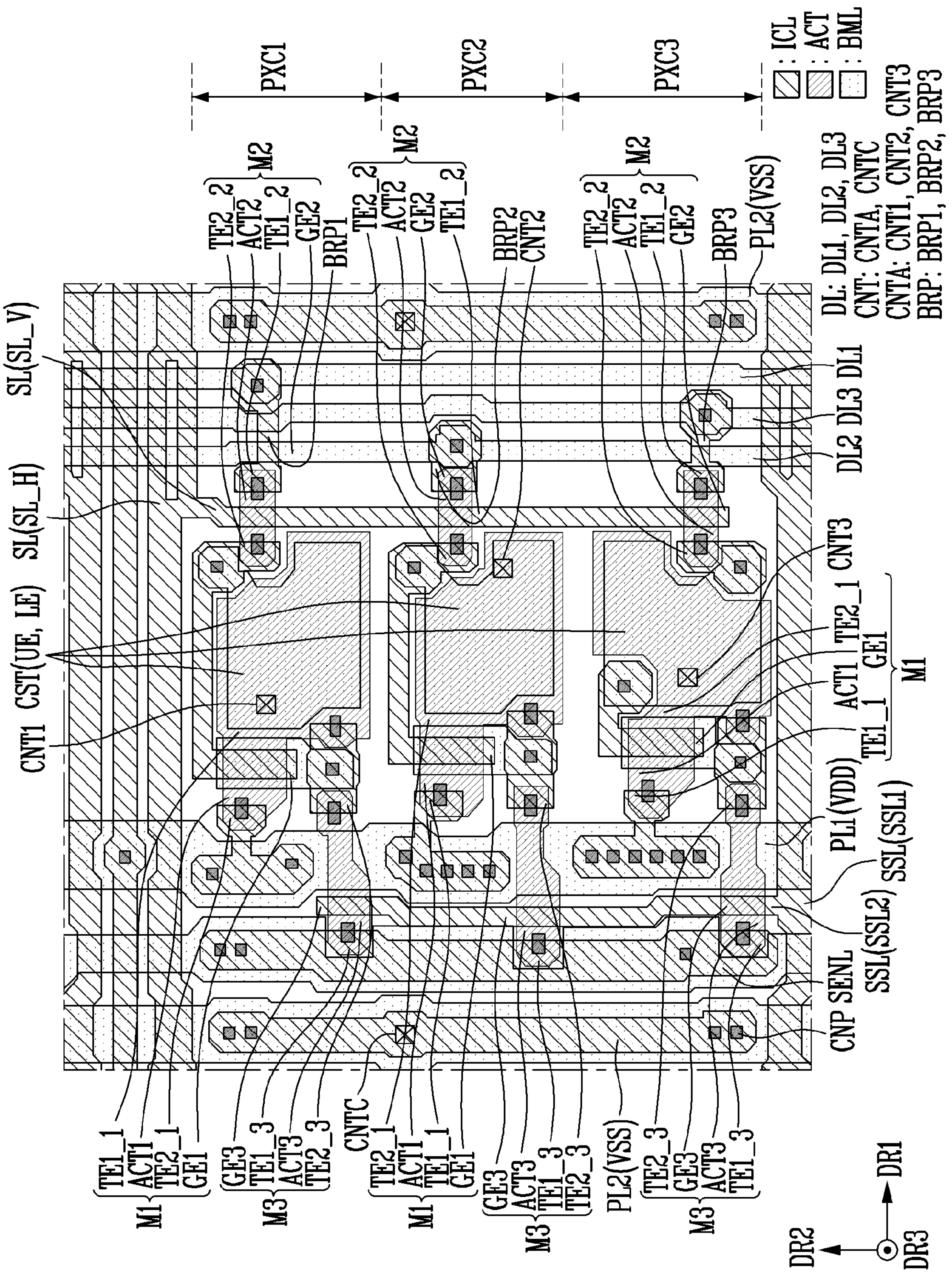
FIGS. 22 and 23 are schematic plan views illustrating an electrode structure according to an embodiment.
Figure 23:
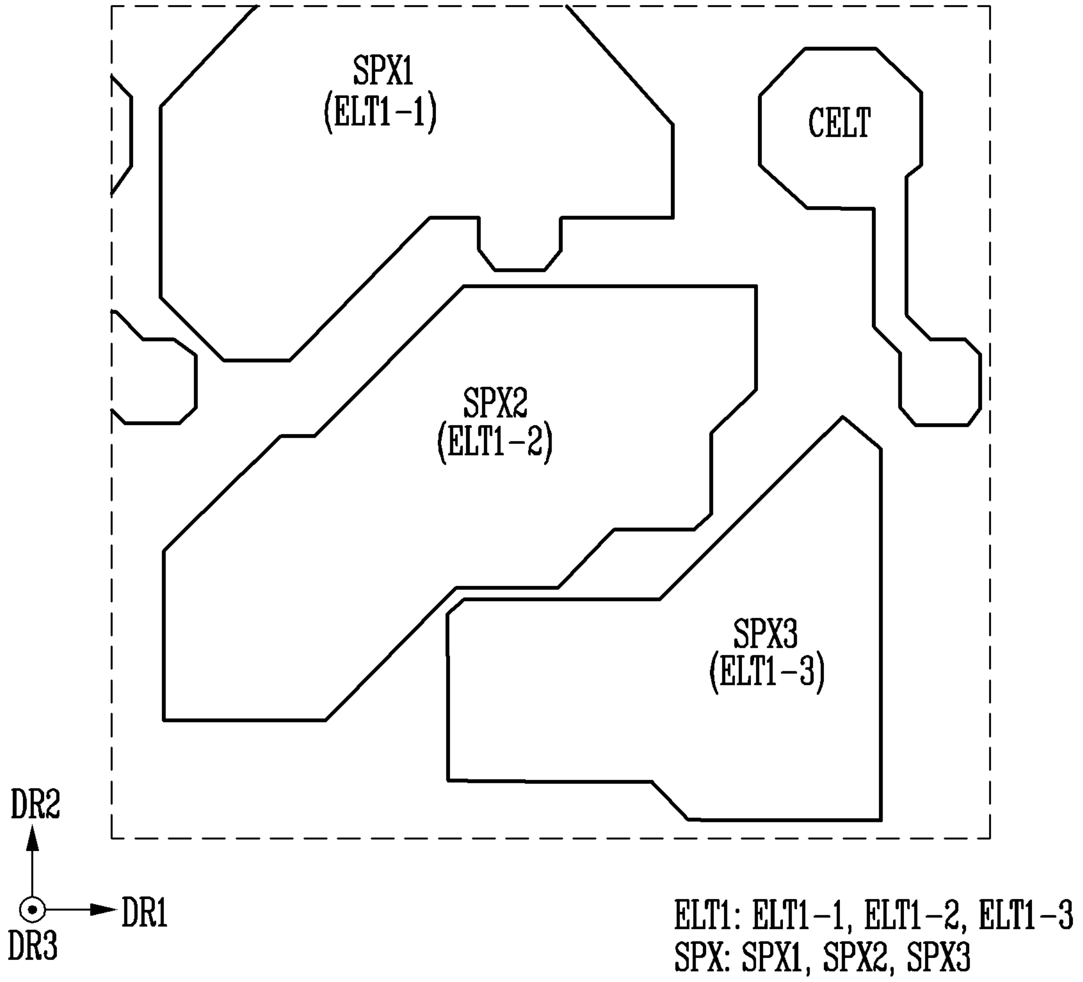
Figure 24:
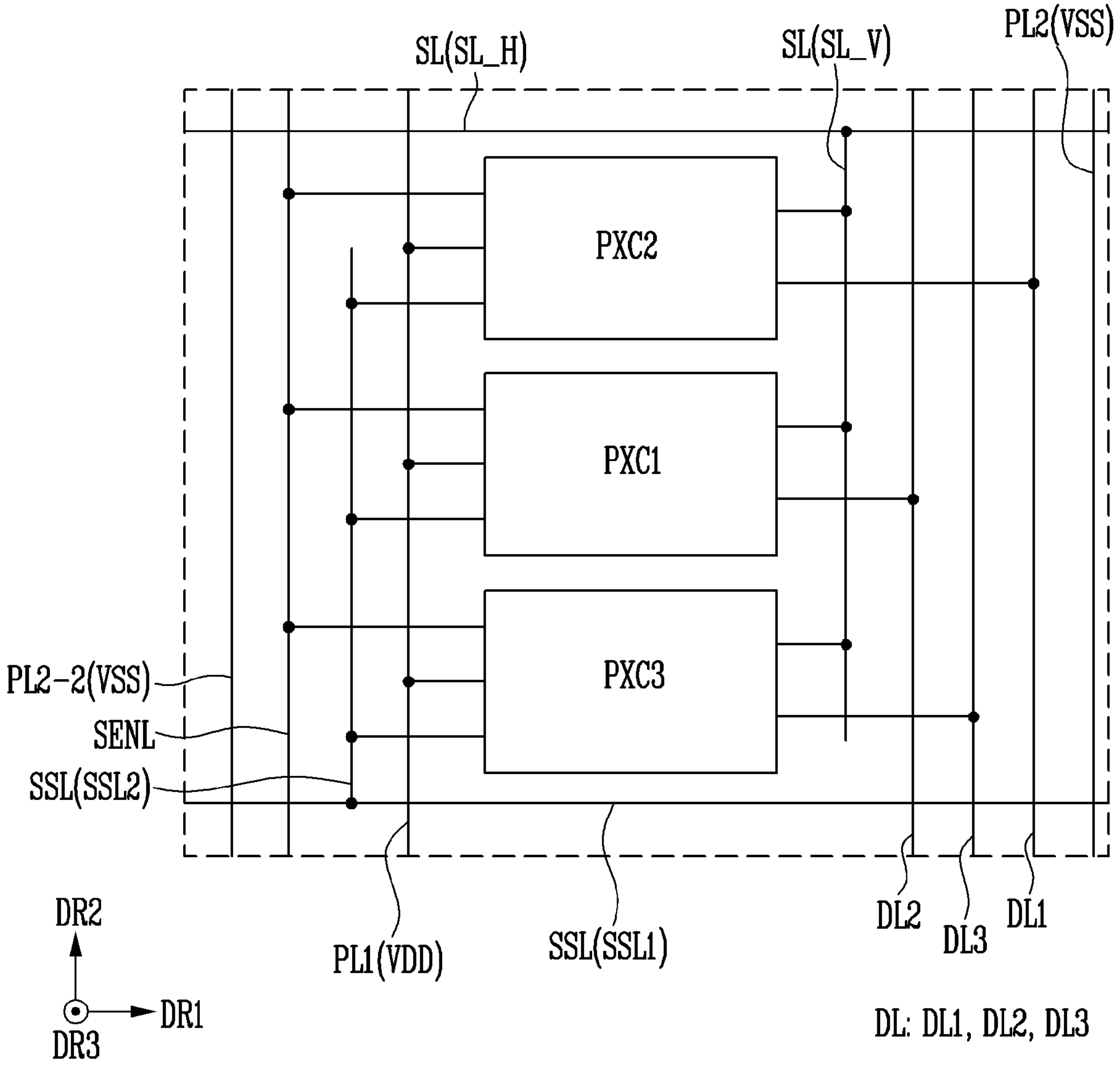
FIG. 24 is a schematic diagram illustrating a connection structure between a pixel circuit and lines according to an embodiment.

FIG. 21 is a schematic cross-sectional view illustrating an electrode structure according to an embodiment. FIGS. 22 and 23 are schematic plan views illustrating an electrode structure according to an embodiment. FIG. 24 is a schematic diagram illustrating a connection structure between a pixel circuit and lines according to an embodiment. FIG. 21 schematically shows a positional relationship on a cross-section between the first electrode ELT1, a bridge pattern BRP, the contact member CNP, and the data line DL.

Figure 12:
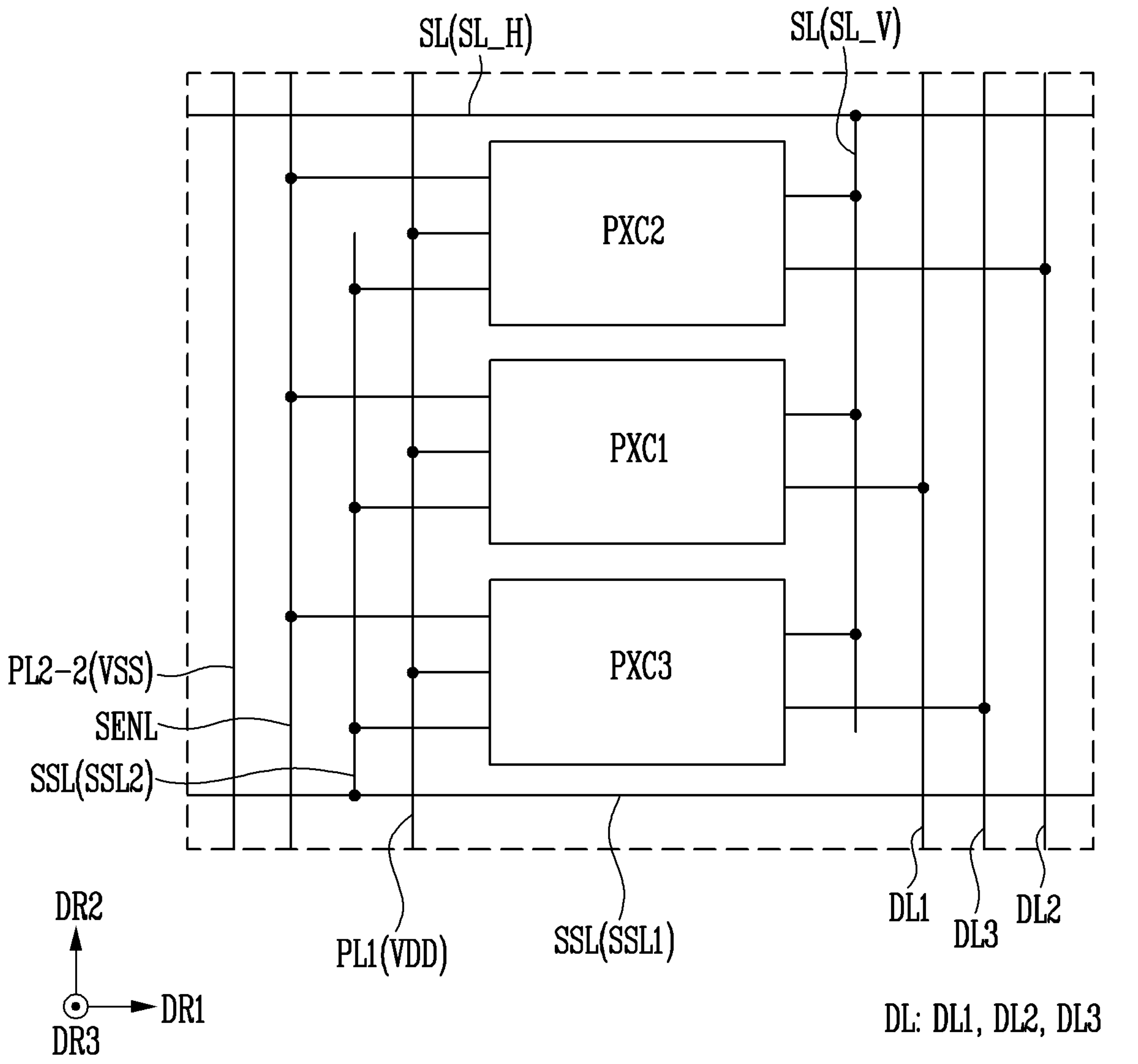
FIG. 12 is a schematic diagram illustrating a connection structure between a pixel circuit and lines according to an embodiment.

FIG. 22 expresses configurations in a manner corresponding to FIG. 10, FIG. 23 expresses configurations in a manner corresponding to FIG. 11, and FIG. 24 expresses configurations in a manner corresponding to FIG. 12. For example, as described above with reference to FIGS. 10 and 11, FIG. 22 shows the lower auxiliary electrode layer BML, the active layer ACT, and the interlayer conductive layer ICL, and FIG. 23 shows the anode contact portion CNTA and the cathode contact portion CNTC and does not show the lower auxiliary electrode layer BML, the active layer ACT, and the interlayer conductive layer ICL, in order to clearly describe a position of the first electrode ELT1 and the connection electrode CELT of the light emitting element LD. FIG. 24 shows a connection relationship between configurations shown in FIG. 22. Referring to FIGS. 22 to 24 together, a position and an electrical connection relationship of respective configurations will be clearly understood.

According to an embodiment, FIGS. 22 and 23 show a disposition structure of the sub-pixels SPX and the pixel circuit PXC according to an embodiment based on the disposition structure of the sub-pixels SPX shown in FIG. 20.

Referring to FIGS. 21 to 24, each of the pixel circuits PXC and lines electrically connected thereto may be disposed. The pixel circuits PXC may be sequentially arranged in the second direction DR2, and lines electrically connected thereto may form an electrical connection structure similar to the structure described above with reference to FIGS. 10 to 12. Accordingly, an electrical connection structure of the pixel circuit PXC for driving the light emitting element LD may be formed.

According to an embodiment, the first electrode ELT1 may overlap the data line DL in a plan view. At this time, the first electrode ELT1 may be the anode electrode of the light emitting element LD emitting light of one color, and may not overlap the contact member CNP, which is electrically connected to the data line DL configured to supply a data signal for emitting light of another color, in a plan view.

For example, the contact member CNP connected to the data line DL for one sub-pixel SPX may overlap the first electrode ELT1 for the same sub-pixel SPX in a plan view. In another embodiment, the contact member CNP connected to the data line DL for one sub-pixel SPX may not overlap the first electrode ELT1 for another sub-pixel SPX in a plan view.

The data line DL may be electrically connected to other lines (for example, the first transistor electrode of the second transistor M2) through the bridge pattern BRP (not shown in FIG. 22). The bridge pattern BRP may include a first bridge pattern BRP1, a second bridge pattern BRP2, and a third bridge pattern BRP3. The contact member CNP may include a first contact member CNP1, a second contact member CNP2, and a third contact member CNP3.

The first bridge pattern BRP1 may be electrically connected to the first data line DL1 through the first contact member CNP1. The first bridge pattern BRP1 may electrically connect the first data line DL1 and the (1_2)-th transistor electrode TE1_2 of the second transistor M2. The second bridge pattern BRP2 may be electrically connected to the second data line DL2 through the second contact member CNP2. The second bridge pattern BRP2 may electrically connect the second data line DL2 and the (1_2)-th transistor electrode TE1_2 of the second transistor M2. The third bridge pattern BRP3 may be electrically connected to the third data line DL3 through the third contact member CNP3. The third bridge pattern BRP3 may electrically connect the third data line DL3 and the (1_2)-th transistor electrode TE1_2 of the second transistor M2.

For example, the (1-1)-th electrode ELT1-1 may not overlap the second contact member CNP2 and the third contact member CNP3 in a plan view. The (1-2)-th electrode ELT1-2 may not overlap the first contact member CNP1 and the third contact member CNP3 in a plan view. The (1-3)-th electrode ELT1-3 may not overlap the first contact member CNP1 and the second contact member CNP2 in a plan view. According to an embodiment, the (1-3)-th electrode ELT1-3 may overlap the third contact member CNP3 in a plan view.

Experimentally, in order to properly perform a repair process on the pixel circuit PXC and lines electrically connected thereto, lines for respectively supplying electrical signals to different sub-pixels SPX may be required not to overlap each other.

As described above, as the second data line DL2 for providing the green sub-pixel is not disposed between the first data line DL1 and the third data line DL3, an electrical connection structure in which an electrical signal is distorted may be formed. As the second data line DL2 is disposed outside, the second contact member CNP2 may not overlap the (1-1)-th electrode ELT1-1 and the (1-3)-th electrode ELT1-3 for providing the red and blue sub-pixels which are different colors.

In particular, in case that the first to third sub-pixels SPX1, SPX2, and SPX3 are arranged on the oblique directions SDR1 and SDR2, a concern that the contact member CNP of the data line DL and the first electrode ELT1 for different colors may overlap exists due to a position of the first electrode ELT1 functioning as the anode electrode, however, as the second data line DL2 is disposed outside, the above-described risk may be reduced.

As a result, a structure in which lines for respectively supplying electrical signals to different sub-pixels SPX do not overlap each other may be manufactured, and a repair process for the pixel circuit PXC and lines electrically connected thereto may be suitably performed. Accordingly, the display device 1 in which a manufacturing defect may be prevented may be provided.

Although the disclosure has been described with reference to certain embodiments, those of ordinary skill in the art will understand that the disclosure may be variously modified and changed without departing from the spirit and scope of the disclosure.

Therefore, the scope of the disclosure should not be limited to the contents described in the detailed description of the specification, but should also include all such modifications and changes apparent from the disclosure.

What is claimed is:

1. A display device, comprising:

sub-pixels disposed on a base layer and including:
- a first sub-pixel;
- a second sub-pixel; and
- a third sub-pixel, wherein the first sub-pixel and the third sub-pixel overlap in a first direction, the second sub-pixel is spaced apart from the first sub-pixel and the third sub-pixel in a second direction different from the first direction, each of the sub-pixels comprises a pixel-circuit layer disposed on the base layer and including a pixel circuit including a first transistor and a second transistor, a data line, and a scan line, and a light-emitting-element layer disposed on the pixel-circuit layer and including a light emitting element, the pixel circuit includes a first pixel circuit included in the first sub-pixel, a second pixel circuit included in the second sub-pixel, and a third pixel circuit included in the third sub-pixel, the data line includes a first data line included in the first sub-pixel and electrically connected to the first pixel circuit, a second data line included in the second sub-pixel and electrically connected to the second pixel circuit, and a third data line included in the third sub-pixel and electrically connected to the third pixel circuit, the first data line, the second data line, and the third data line are adjacent to each other in the first direction, and the second data line is not disposed between the first data line and the third data line such that only one side of the second data line faces the first data line and the third data line.

2. The display device according to claim 1, wherein the second data line is disposed between the pixel circuit and the first data line and the third data line.

3. The display device according to claim 2, wherein the third pixel circuit, the first pixel circuit, and the second pixel circuit are sequentially disposed in the second direction.

4. The display device according to claim 1, wherein the first data line and the third data line are disposed between the pixel circuit and the second data line.

5. The display device according to claim 4, wherein the third pixel circuit, the second pixel circuit, and the first pixel circuit are sequentially disposed in the second direction.

6. The display device according to claim 1, wherein the first sub-pixel, the second sub-pixel, and the third sub-pixel form a pixel part, the pixel part includes a plurality of pixel parts, the plurality of pixel parts are disposed according to a matrix defined by a pixel row in the first direction and a pixel column in the second direction, the pixel row includes a first pixel row and a second pixel row, the pixel column includes a first pixel column and a second pixel column, the plurality of pixel parts include a first pixel part disposed in the first pixel row and the first pixel column and a second pixel part disposed in the second pixel row and the first pixel column, and the first pixel column and the first sub-pixel and the third sub-pixel in the first pixel column form an additional pixel part with the second sub-pixel in the second pixel column and the first pixel column.

7. The display device according to claim 6, wherein the scan line includes:

a first scan line corresponding to the sub-pixels disposed in the first pixel row; and a second scan line corresponding to the sub-pixels disposed in the second pixel row.

8. The display device according to claim 7, wherein the display device may display an image of checker pattern, and in case that the display device displays the image of checker pattern, the first pixel part displays a white box and the second pixel part displays a black box.

9. The display device according to claim 8, wherein in case that the display device displays the image of the checker pattern, and in case that the display device displays the image of checker pattern, the first sub-pixel, the second sub-pixel, and the third sub-pixel of the first pixel part emit light, and the first sub-pixel, the second sub-pixel, and the third sub-pixel of the second pixel part do not emit light.

10. The display device according to claim 9, wherein in case that the display device displays the image of checker pattern, data signals of a same voltage direction are supplied to the first data line, the second data line, and the third data line, respectively.

11. The display device according to claim 10, wherein the display device may display an image of inverted-checker pattern, and in case that the display device displays the image of inverted-checker pattern, a portion of the first pixel part displays a black box, another portion of the first pixel part and a portion of the second pixel part display a white box, and another portion of the second pixel part displays a black box.

12. The display device according to claim 11, wherein in case that the display device displays the image of inverted-checker pattern, the first sub-pixel and the third sub-pixel of the first pixel part emit light, the second sub-pixel of the first pixel part does not emit light, the second sub-pixel of the second pixel part emits light, and the first sub-pixel and the third sub-pixel of the second pixel part do not emit light.

13. The display device according to claim 12, wherein in case that the display device displays the image of inverted-checker pattern, data signals of a voltage direction different from that of a voltage supplied to the second data line and the third data line are supplied to the second data line.

14. The display device according to claim 1, wherein the light emitting element includes a first electrode, a second electrode, and a light emitting layer electrically connected between the first electrode and the second electrode, the first electrode is an anode electrode, and includes a (1-1)-th electrode, a (1-2)-th electrode, and a (1-3)-th electrode, the (1-1)-th electrode is included in the first sub-pixel, the (1-2)-th electrode is included in the second sub-pixel, the (1-3)-th electrode is included in the third sub-pixel, the first sub-pixel is a red sub-pixel, the second sub-pixel is a green sub-pixel, and the third sub-pixel is a blue sub-pixel.

15. The display device according to claim 14, wherein the light emitting element includes an organic light emitting diode (OLED).

16. A display device that displays an image of checker pattern and an image of inverted-checker pattern, comprising:

pixel parts disposed on a base layer and including sub-pixels respectively including a first sub-pixel, a second sub-pixel, and a third sub-pixel, wherein the pixel parts are disposed according to a matrix defined by a pixel row on a first direction and a pixel column on a second direction different from the first direction, each of the sub-pixels includes a pixel-circuit layer disposed on the base layer and including a pixel circuit including a first transistor and a second transistor, a data line, and a scan line, and a light-emitting-element layer disposed on the pixel-circuit layer and including a light emitting element, the scan line includes a first scan line and a second scan line extending in the first direction and spaced apart in the second direction, the pixel row includes a first pixel row and a second pixel row, the pixel column includes a first pixel column and a second pixel column, the pixel parts include first pixel parts disposed in the first pixel row and second pixel parts disposed in the second pixel row, the first scan line corresponds to the first pixel parts, the second scan line corresponds to the second pixel parts, the pixel circuit includes a first pixel circuit included in the first sub-pixel, a second pixel circuit included in the second sub-pixel, and a third pixel circuit included in the third sub-pixel, the data line includes a first data line included in the first sub-pixel and electrically connected to the first pixel circuit, a second data line included in the second sub-pixel and electrically connected to the second pixel circuit, and a third data line included in the third sub-pixel and electrically connected to the third pixel circuit, in case that the display device displays the image of checker pattern, the first sub-pixel, the second sub-pixel, and the third sub-pixel of the first pixel part disposed in the first pixel row and the first pixel column emit light, and the first sub-pixel, the second sub-pixel, and the third sub-pixel of the second pixel part disposed in the second pixel row and the first pixel column do not emit light, in case that the display device displays the image of inverted-checker pattern, the first sub-pixel and the third sub-pixel of the first pixel part disposed in the first pixel row and the first pixel column emit light, the second sub-pixel does not emit light, the first sub-pixel and the third sub-pixel of the second pixel part disposed in the second pixel row and the first pixel column do not emit light, and the second sub-pixel emits light, the first data line, the second data line, and the third data line are adjacent to each other in the first direction, and the second data line is not disposed between the first data line and the third data line such that only one side of the second data line faces the first data line and the third data line.

17. A display device, comprising:

pixel parts disposed on a base layer and including sub-pixels respectively including a first sub-pixel, a second sub-pixel, and a third sub-pixel, wherein the pixel parts are disposed according to a matrix defined by a pixel row on a first direction and a pixel column on a second direction different from the first direction, each of the sub-pixels includes a pixel-circuit layer disposed on the base layer and including a pixel circuit including a first transistor and a second transistor, a data line, and a scan line, and a light-emitting-element layer disposed on the pixel-circuit layer and including a light emitting element, the sub-pixels are spaced apart from each other in an oblique direction different from the first direction and the second direction, the pixel circuit includes a first pixel circuit included in the first sub-pixel, a second pixel circuit included in the second sub-pixel, and a third pixel circuit included in the third sub-pixel, the data line includes a first data line included in the first sub-pixel and electrically connected to the first pixel circuit, a second data line included in the second sub-pixel and electrically connected to the second pixel circuit, and a third data line included in the third sub-pixel and electrically connected to the third pixel circuit, the first data line, the second data line, and the third data line are adjacent to each other in the first direction, and the second data line is not disposed between the first data line and the third data line such that only one side of the second data line faces the first data line and the third data line.

18. The display device according to claim 17, wherein the light emitting element includes a first electrode, a second electrode, and a light emitting layer electrically connected between the first electrode and the second electrode, the first electrode is an anode electrode, and includes a (1-1)-th electrode, a (1-2)-th electrode, and a (1-3)-th electrode, the (1-1)-th electrode is included in the first sub-pixel, the (1-2)-th electrode is included in the second sub-pixel, the (1-3)-th electrode is included in the third sub-pixel, the first sub-pixel is a red sub-pixel, the second sub-pixel is a green sub-pixel, and the third sub-pixel is a blue sub-pixel.

19. The display device according to claim 18, further comprising:

a first bridge pattern electrically connected to the first data line through a first contact member;

a second bridge pattern electrically connected to the second data line through a second contact member; and a third bridge pattern electrically connected to the third data line through a third contact member, wherein the (1-2)-th electrode does not overlap the first contact member and the third contact member in a plan view.

20. The display device according to claim 19, wherein the (1-3)-th electrode overlaps the third contact member in a plan view.

* * * * *